United States Patent [19]
Korenaga et al.

[11] Patent Number: 5,608,773
[45] Date of Patent: Mar. 4, 1997

[54] MASK HOLDING DEVICE, AND AN EXPOSURE APPARATUS AND A DEVICE MANUFACTURING METHOD USING THE DEVICE

[75] Inventors: Nobusige Korenaga, Sagamihara; Kouichi Hara, Hadano; Shinichi Hara, Yokohama, all of Japan

[73] Assignee: Canon Kabushiki Kaisha, Tokyo, Japan

[21] Appl. No.: 348,837

[22] Filed: Nov. 29, 1994

[30] Foreign Application Priority Data

Nov. 30, 1993 [JP] Japan .................................. 5-299917
Nov. 30, 1993 [JP] Japan .................................. 5-299918

[51] Int. Cl.$^6$ ............................................. G03B 11/00
[52] U.S. Cl. ........................................... 378/34; 378/208
[58] Field of Search ............................. 378/34, 35, 208, 378/205; 250/491.1, 492.1; 29/464, 465, 466, 467; 269/24

[56] References Cited

U.S. PATENT DOCUMENTS

| | | | |
|---|---|---|---|
| 4,372,248 | 2/1983 | Martin | 118/720 |
| 4,534,047 | 8/1985 | Deschenaux et al. | 378/35 |
| 4,544,311 | 10/1985 | Husain | 250/491.1 X |
| 4,633,810 | 1/1987 | Martin | 118/721 |
| 4,682,277 | 7/1987 | Yazaki | 362/296 |
| 5,026,239 | 6/1991 | Chiba et al. | 414/217 |
| 5,073,912 | 12/1991 | Kobayashi et al. | 378/34 |
| 5,161,177 | 11/1992 | Chiba | 378/34 |
| 5,253,012 | 10/1993 | Chiba et al. | 355/53 |

*Primary Examiner*—David P. Porta
*Attorney, Agent, or Firm*—Fitzpatrick, Cella, Harper & Scinto

[57] ABSTRACT

A mask for exposure is supported at three positions on a holding surface of a mask chuck of an X-ray exposure apparatus by means of kinematic mounting. Magnetic units, each comprising an electromagnet, and magnetic rings are provided around supporting points at the three positions on the mask chuck and on the mask frame, respectively. It is thereby possible to generate a tensile force to magnetically attract the mask frame in the direction of the normal of the holding surface of the mask chuck, and to attract and hold the mask on the mask chuck. Thus, the mask can be chucked on the X-ray exposure apparatus in substantially the same state as that of a mechanical clamp on an electron beam (EB) scanning apparatus while the mask is manufactured, without using a mechanical clamping mechanism.

25 Claims, 21 Drawing Sheets

MAGNETIC LINE OF FORCE

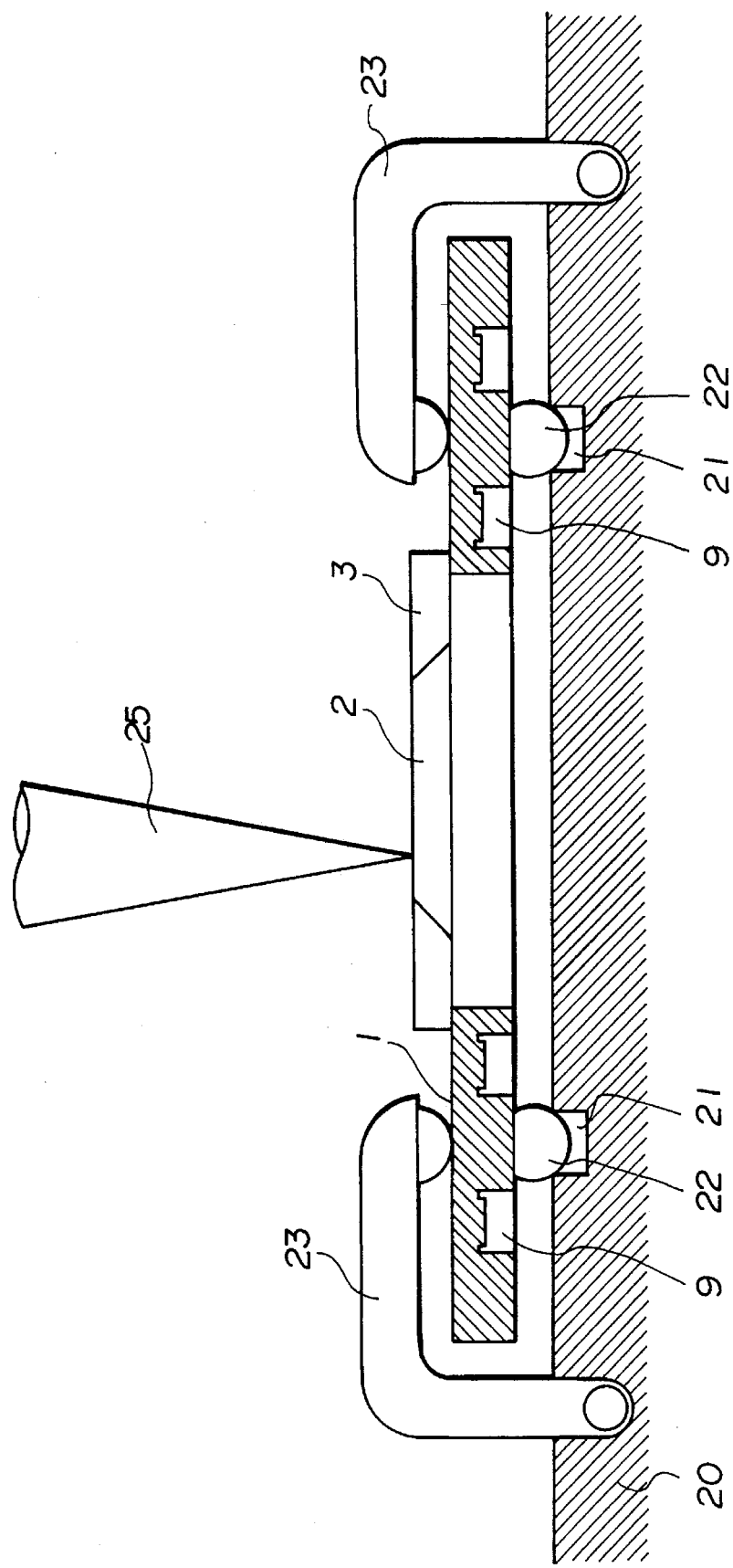

MASK HOLDING DEVICE, AND AN EXPOSURE APPARATUS AND A DEVICE MANUFACTURING METHOD USING THE DEVICE

BACKGROUND OF THE INVENTION

1. Field of the Invention

This invention relates to the holding of a mask used in an exposure apparatus or the like.

2. Description of the Related Art

Recently, the degree of integration of semiconductor integrated circuits is moving toward higher density. In semiconductor manufacturing apparatuses for manufacturing semiconductor integrated circuits, the width of printed lines is becoming smaller in accordance with the tendency toward higher integration, so that higher accuracy in exposure is required. In order to further reduce the width of printed lines, it is effective to shorten the wavelength of light from a light source used for exposure. Hence, X-ray exposure apparatuses using X-rays whose wavelength is shorter than that of ultraviolet light, which is now typically used, are being developed.

FIGS. 23(a) and 23(b) schematically illustrate an X-ray mask and a mask chuck mounted in a conventional proximity-gap-type X-ray exposure apparatus. FIG. 23(a) illustrates the X-ray mask 99. In FIG. 23(a), there are shown a rein-forcing mask frame 100, and a mask substrate 101 made of silicon. An inorganic film (mask membrane) 102 is formed by removing a portion of the mask substrate 101 by back etching. A transfer pattern 103, comprising a semiconductor circuit or the like, is formed on the mask membrane 102, for example, by scanning of an electron beam by an EB (electron beam) scanning apparatus. A magnetic ring 105, made of a magnetic material, is buried in the mask frame 100.

FIG. 23(b) illustrates a magnetic-attraction-type mask chuck. In FIG. 23(b), a hole 111 for passing X-rays for exposure is provided in a ring-shaped chuck base 110. Magnetic units 112 are arranged in the form of a circle so as to face the magnetic ring 105, and generate a sufficient magnetic force to attract and hold the X-ray mask. In this configuration, the mask frame 100 of the X-ray mask is magnetically attracted to and held on a holding surface of the chuck base 110 in a state of surface contact. A vacuum attraction method may also be adopted instead of the above-described magnetic attraction method. In this method, vacuum ports are used instead of the magnetic units, so that the mask frame is in surface contact with the chuck base by being attracted to and held by a vacuum force.

However, in these attraction holding methods, since the mask frame 100 is in surface contact with the chuck base 110, the contact surface between the two members must be finished to a high flatness. Even if slight distortion, such as warp or the like, is present in the attracting surface of the mask frame 100 when forming a transfer pattern by an EB scanning apparatus during mask manufacture, the mask frame 100 is deformed due to the correction of the warp of the mask frame 100 when the mask frame 100 is held on the chuck base 110 of the X-ray exposure apparatus. There is the possibility that the stress caused by the deformation is transmitted to the transfer pattern 103 via the mask membrane 102, and that the transfer pattern 103 is distorted from the original pattern. The thickness of the mask membrane 102, on which the transfer pattern 103 is formed, is about 2 µm. Hence, the stiffness of the mask membrane 102 is much smaller than those of the mask substrate 101 and the mask frame 100 having thicknesses of about a few millimeters. Accordingly, distortion in the mask substrate 101 and the mask frame 100 greatly influences the mask membrane 102, thereby causing great distortion in the transfer pattern 103. This problem is peculiar to a mask in which a transfer pattern is formed on a very thin mask membrane.

In order to solve the above-described problem, a method of holding an X-ray mask in a state in which the mask is not deformed by a holding force when it is chucked in a mask chuck, i.e., in a state of holding a distorted state of the mask frame when a pattern has been formed on the mask has been proposed. This method will be hereinafter termed a kinematic mounting method.

FIGS. 24(a) and 24(b) illustrate an example of kinematic mounting. FIG. 24(a) illustrates an X-ray mask 99 for kinematic mounting. In FIG. 24(a), reference numeral 117 represents a conical-hole portion. Reference numeral 118 represents a flat portion. A V-groove portion 119 comprises a slit formed linearly in the x direction of the conical hole 117. These portions are formed on the holding surface of the mask frame 100. FIG. 24(b) illustrates a mask chuck for kinematic mounting. Spherical projections 120, engaging with the conical portion 117, the flat portion 118 and the V-groove portion 119 of the mask, are provided at three positions. A clamping mechanism 115 for mechanically pressing and holding the mask is provided at each of the three positions.

In this configuration, the following holding states are provided at the respective positions, so that six degrees of freedom of the mask can be positioned without being excessively constrained.

|  | Restrained | Free |
|---|---|---|
| Conical-hole portion 17 | X, Y, Z | — |
| Flat portion 18 | Z | X, Y |
| V-groove portion 19 | Y, Z | X |

According to this kinematic mounting method, an external force to deform the mask frame 100 while the mask is held during exposure is little exerted, so that the mask can be held (without distortion) in the same state as when the mask pattern is formed by an EB scanning apparatus. Hence, the distortion of the pattern due to the deformation of the mask-supporting frame can be prevented.

In the above-described example of kinematic mounting, however, the clamping mechanism 115 is provided at the side of the wafer, which faces the mask in the vicinity thereof, i.e., at the side of a proximity gap. In order to prevent the clamping mechanism from contacting the wafer, the thickness of the cross section of a portion, where the transfer pattern is formed, of the mask must be greater than the sum of the thickness of the cross section of the clamping mechanism and the thickness of the cross section of a clamped portion of the mask frame. Particularly in a vertical X-ray exposure apparatus, the mask must be held on the mask chuck in a vertical state. Accordingly, a sufficient clamping force to overcome the force of gravity must be generated by the clamping mechanism. Hence, it is difficult to provide a thin clamping mechanism, so that it is also difficult to provide a thin mask.

That is, a strong clamping force is incompatible with a thin mask. Furthermore, a complicated sequence and a fail-safe mechanism are required in order to prevent the wafer and the clamping mechanism from contacting each other.

Accordingly, apart from EB exposure apparatuses which do not have the particular problem of a proximity gap, in proximity-gap-type X-ray exposure apparatuses, it is not very desirable to press and hold a mask by a mechanical clamping mechanism.

When, for example, it is intended to vertically hold a mask against the force of gravity by the above-described kinematic mounting method, the mask must be inevitably clamped. Since a frictional force generated between the clamping mechanism and the mask, and the mask's own weight are added, strictly speaking, a state of excessive constraint is provided, so that it is difficult to exactly position the mask. Furthermore, due to the excessive constraint, a moment force is generated in the mask, thereby causing the generation of pattern distortion.

SUMMARY OF THE INVENTION

It is an object of the present invention to solve the above-described problems.

It is another object of the present invention to provide a mask-holding device, in which, in three-point-supporting chucking, such as kinematic mounting or the like, a mask can be held during X-ray exposure in substantially the same state as when the mask has been manufactured by EB scanning, without using a mechanical clamping mechanism, and to provide an exposure apparatus, a device-manufacturing method, and the like which use the device.

It is still another object of the present invention to provide a kinematic mounting method and a mask in which the mask can be very precisely positioned and held even if the mask is inclined with respect to the horizontal direction, and a device-manufacturing method which uses the method and the mask.

According to one aspect, the present invention, which achieves these objectives, relates to a mask holding device, comprising a holding surface for supporting a mask at three positions, and non-mechanical force generation means, provided at positions corresponding to the three positions, for generating a force to pull the mask toward the supporting surface.

According to another aspect, the present invention relates to an exposure apparatus, comprising a mask holding apparatus, which comprises (i) a holding surface for supporting a mask at three positions, and (ii) non-mechanical force generation means, provided at positions corresponding to the three positions, for generating a force to pull the mask toward the holding surface, and exposure means for exposing and transferring a transfer pattern provided on the mask held on the mask holding device onto a wafer.

According still another aspect, the present invention relates to a mask holding method, comprising the steps of providing a mask with a conical-hole portion, a V-groove portion and a flat portion, first pressing the conical-hole portion among the three portions against a corresponding projection of a mask chuck, and engaging the conical-hole portion, the V-groove portion and the flat portion provided on the mask with three projections provided on a mask chuck and pressing them against each other to hold the mask at three positions.

According to yet another aspect, the present invention relates to a mask holding method, comprising the steps of providing a mask with a conical-hole portion, a V-groove portion and a flat portion, and engaging the conical-hole portion, the V-groove portion and the flat portion provided on the mask with three projections provided on a mask and pressing them against each other, to vertically hold the mask at three positions against gravity. The conical-hole portion, among the three portions, has the largest pressing force.

According to yet a further aspect, the present invention relates to a mask holding method, comprising the steps of providing a mask with a conical-hole portion, a V-groove portion and a flat portion, the conical-hole portion being the uppermost portion on the mask, and engaging the conical-hole portion, the V-groove portion and the flat portion provided on the mask with three projections provided on a mask chuck and pressing them against each other, to vertically hold the mask at three positions against gravity.

According to still a further aspect, the present invention relates to a mask, comprising a transfer pattern, a mask frame having a holding surface, and a conical-hole portion, a V-groove portion and a flat portion provided at three positions on the holding surface. An angle of the conical-hole portion is greater than an angle of the V-groove portion, with respect to the holding surface.

The foregoing and other objects, advantages and features of the present invention will become more apparent from the following description of the preferred embodiments taken in conjunction with the accompanying drawings.

BRIEF DESCRIPTION OF THE DRAWINGS

FIG. 3 is a diagram illustrating the configuration of an electron beam (EB) scanning apparatus according to the first embodiment;

DESCRIPTION OF THE PREFERRED EMBODIMENTS

First Embodiment

Figure 1A:
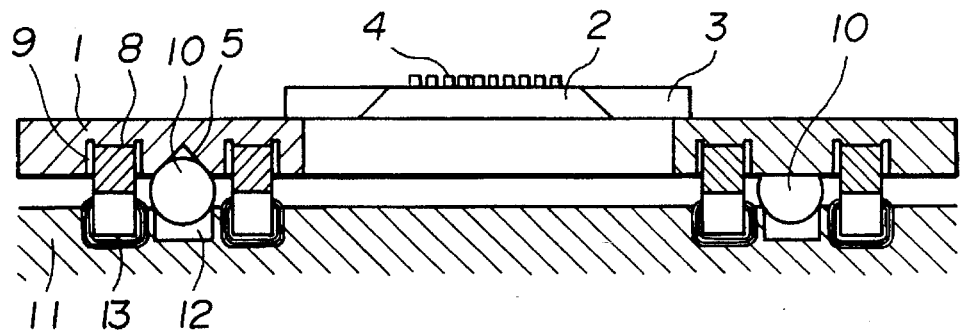
FIGS. 1(a) and 1(b) are diagrams illustrating the configuration of an X-ray exposure apparatus according to a first embodiment of the present invention.
Figure 1B:
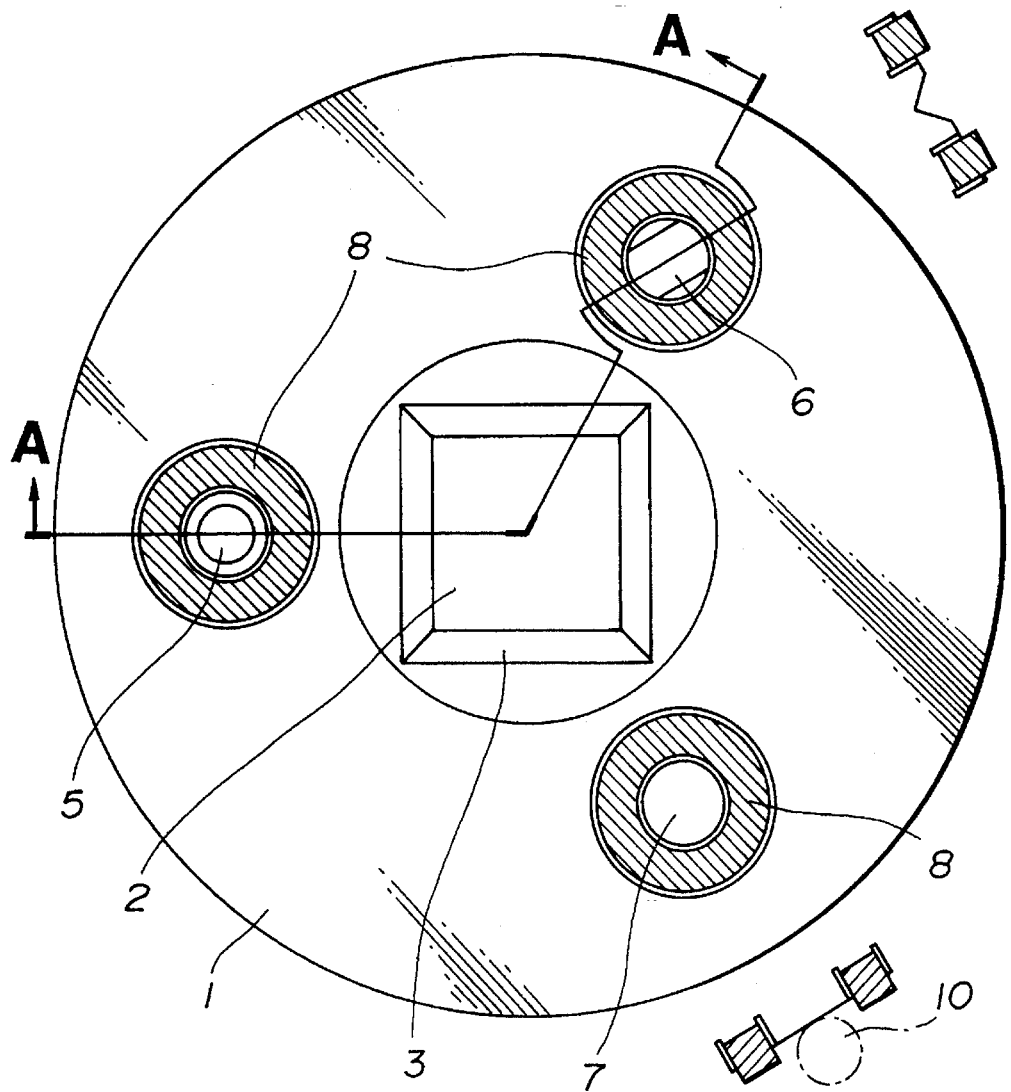
Figure 2A:
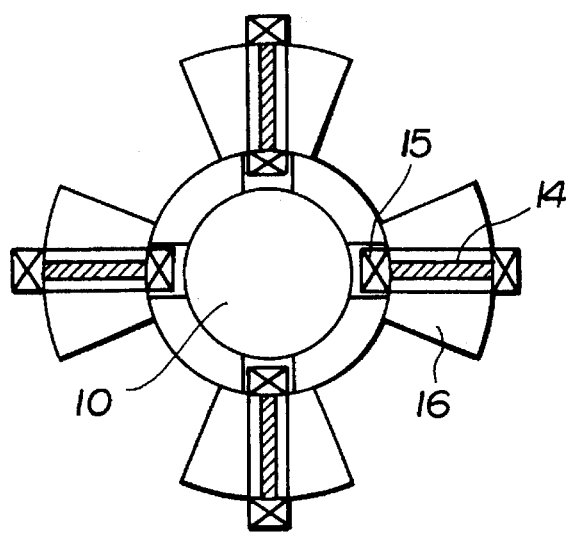
FIGS. 2(a) through 2(c) are diagrams illustrating the details of a magnetic unit shown in FIGS. 1(a) and 1(b)
Figure 2B:
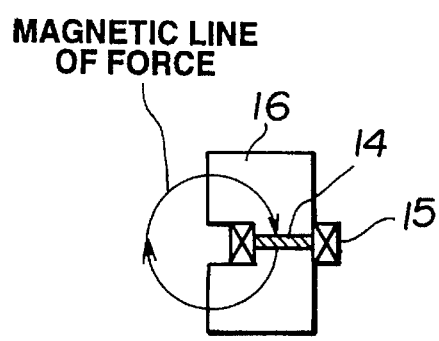
Figure 2C:
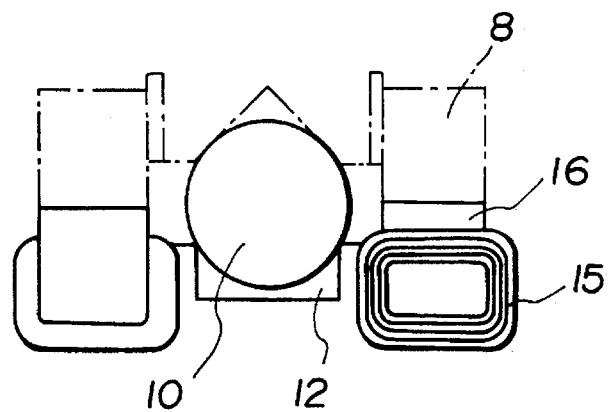

A description will now be provided of a first embodiment of the present invention with reference to the drawings. FIGS. 1(a) and 1(b) are diagrams illustrating the configuration of a mask chuck of an X-ray exposure apparatus in a state of mounting an X-ray mask thereon. FIGS. 2(a) through 2(c) are diagrams illustrating the details of a magnetic chuck. FIG. 3 is a diagram illustrating a state in which a mask is mounted in an electron beam (EB) scanning apparatus.

In FIGS. 1(a) and 1(b), the X-ray mask comprises a mask substrate (silicon wafer) 3 having a mask membrane (inorganic film) 2, on which a transfer pattern 4, made of gold or the like, is formed, bonded on the surface of a mask frame 1. A conical-hole portion 5, a V-groove portion 6, and a flat portion 7, having the same configuration as in the above-described conventional approach, for contacting three spheres 10 provided on the mask chuck are provided at the back of the mask frame 1. A ring-shaped groove 9 for mounting ring-shaped magnetic rings 8 is provided around the above-described portions together with a clearance groove for processing. As will be described later, the magnetic rings 8 are not mounted when manufacturing the X-ray mask with an EB scanning apparatus. However, when fixing the completed X-ray mask on the mask chuck of the exposure apparatus, the magnetic rings 8 are mounted on the mask by means of bonding or the like. A magnetic material, such as stainless steel or the like, is used for the magnetic rings 8.

A mask chuck 11 is provided on the main body of the exposure apparatus. Engaging holes 12 are provided at three portions, which correspond to the above-described conical-hole portion, V-groove portion and flat portion, on the surface of the mask chuck 11, and the three spheres 10 are fixed in the engaging holes 12. When the mask is mounted on the mask chuck 11, the center of the spheres 10 and the center of the magnetic ring 8 are present on the same normal. The height of protrusion of each of the spheres 10 with respect to the surface of the mask chuck 11 is adjusted so that the surface of the mask chuck 11 is parallel to the lower surface of the mask frame 1. This can be achieved by providing different sizes for the respective engaging holes 12, or providing different sizes for the respective spheres 10.

As a modification of the present embodiment, projections whose distal ends are spherical may be fixed in the engaging holes 12 instead of the spheres 10. Although in the present embodiment, the three spheres are provided at the side of the mask chuck, and the conical-hole portion, the V-groove portion and the flat portion are provided at the side of the mask frame, these components may be disposed vice versa. The portions engaging with the spheres are not necessarily the conical-hole portion, the V-groove portion and the flat portion, but, for example, three V-groove portions may be provided, provided that six degrees of freedom can be appropriately constrained. These modifications may be applied not only to the present embodiment, but also to the following embodiments subsequent to the second embodiment in the same manner.

Four electromagnet units 13 are axi-symmetrically disposed around each of the three spheres 10 (i.e., twelve electromagnet units 13 in total).

FIGS. 2(a) through 2(c) illustrate the details of the electromagnet unit 13 in three drawings. Each unit 13 comprises a permanent magnet 14, a coil 15, and yokes 16. The permanent magnet 14 is magnetized in the direction of the thickness, and generates magnetic lines of force circulating from one of the yokes 16 to another yoke 16 via the magnetic ring 8 provided at the side of the mask. The coil 15 is wound so that the normal of a flat portion, where a current loop is present, coincides with the direction of the magnetic lines of force.

In the process of manufacturing the X-ray mask, a SiC membrane is deposited in a vacuum, back etching is then performed, and the obtained mask substrate is bonded on the mask frame. Thereafter, as shown in FIG. 3, the mask frame 1 is mounted on a mask chuck 20 of an EB scanning apparatus, and patterning is performed by an electron beam 25. Engaging holes 21 having the same positional relationship as in the above-described mask chuck 11 of the X-ray exposure apparatus, and three spheres 22 are fixed in the corresponding engaging holes 21. Three clamp arms 23 for holding the mask are provided so as to correspond to these spheres 22. Each of the clamp arms 23 pushes the center of the corresponding sphere 22.

In order to fix the X-ray mask on the EB scanning apparatus in order to manufacture the mask, the mask frame 1 is positioned so that the conical-hole portion 5, the V-groove portion 6 and the flat portion 7 contact the corresponding three spheres 22 of the mask chuck 20, and is then clamped by the three clamp arms 23. The vector of each clamping force passes through the center of the corresponding sphere 22, and is perpendicular to the surface of the pattern. Since the mask is held by kinematic mounting, the pattern is not distorted. When the mask pattern has been formed, the magnetic rings 8 are mounted on the magnetic-ring mounting surface of the ring-shaped groove 9 in the mask frame 1 by means of bonding or the like, and the mask is completed. The magnetic rings 8 are mounted by performing fine adjustment using a jig so that when the X-ray mask is mounted in the X-ray exposure apparatus, the mask faces the yokes of the mask chuck with a gap of about several tens of micrometers.

A description will now be provided of procedures when mounting the completed mask in the X-ray exposure apparatus. First, current is supplied to the coils 15 of the electromagnet units 13 of the magnetic chuck 11 of the X-ray exposure apparatus in a direction so as to cancel the magnetic lines of force of the electromagnets 14. At that time, the electromagnet units 13 of the mask chuck 11 exert no force even if the magnetic rings 8 face the yokes 16 with a fine gap. Thereafter, the mask frame 1 is positioned by a mask hand (not shown) so that the conical-hole portion 5, the V-groove portion 6 and the flat portion 7 of the mask frame 1 contact the corresponding three spheres 10 on the mask chuck 11, and the current supply to the coils 15 of the electromagnet units 13 is thereafter interrupted. In this state, the three magnetic rings 8 are attracted toward the mask chuck due to the magnetic lines of force of the permanent magnets 14 while maintaining a fine gap with the surfaces of the yokes 16, and the X-ray mask is fixed by making the three spheres 10 mechanical references. Since the mask is placed so that the spheres are present at the centers of the corresponding magnetic rings 8, and the electromagnet units 13 are axi-symmetically disposed around each of the spheres 10, the vector or, the resultant of tensile forces applied to each of the magnetic rings 8 passes through the center of the sphere 10, and is perpendicular to the surface of the magnetic chuck. Accordingly, the mechanical references for positioning, the position and the direction of the vector of the holding force are identical when the X-ray mask is fixed on the X-ray exposure apparatus and when the X-ray mask is fixed on the EB scanning apparatus, so that the mask can be held and fixed in the same state. As a result, pattern distortion is not produced between EB scanning and X-ray exposure, so that very precise exposure and transfer can be performed.

Second Embodiment

Figure 4A:
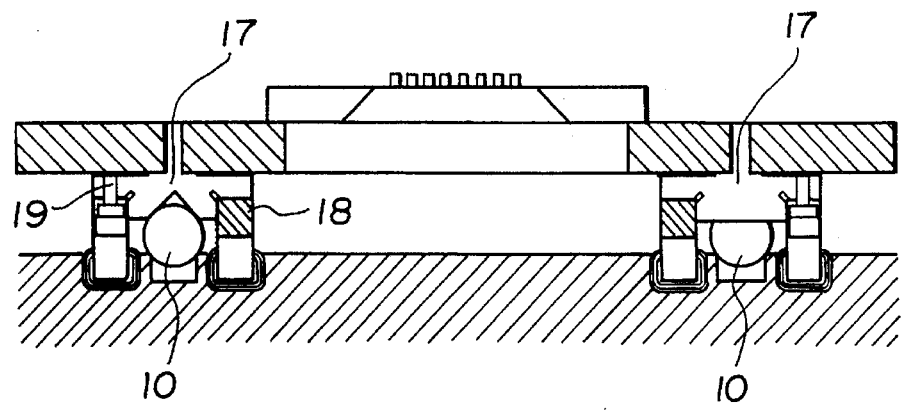
FIGS. 4(a) and 4(b) are diagrams illustrating the configuration of an X-ray exposure apparatus according to a second embodiment of the present invention.
Figure 4B:
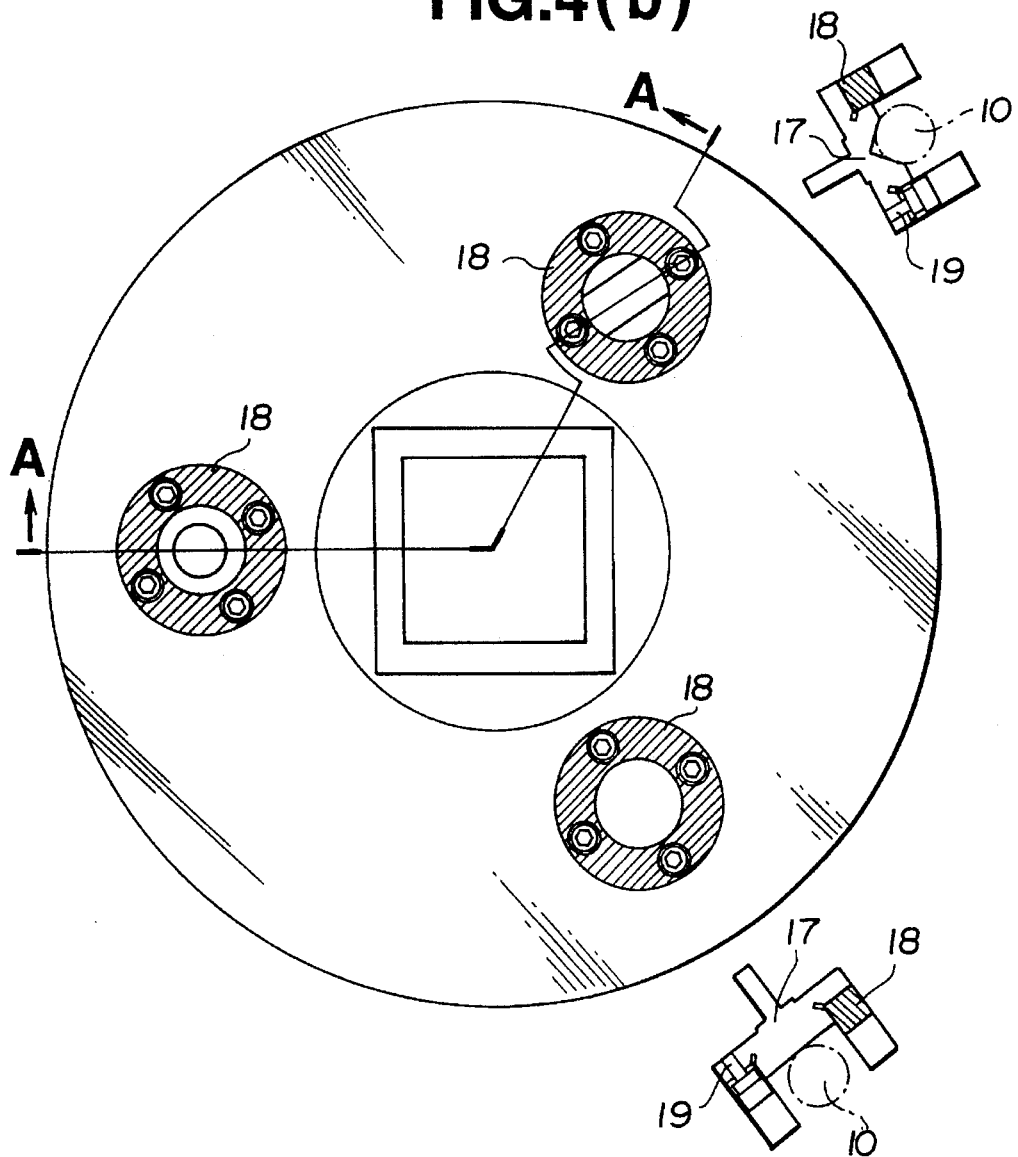
Figure 5:
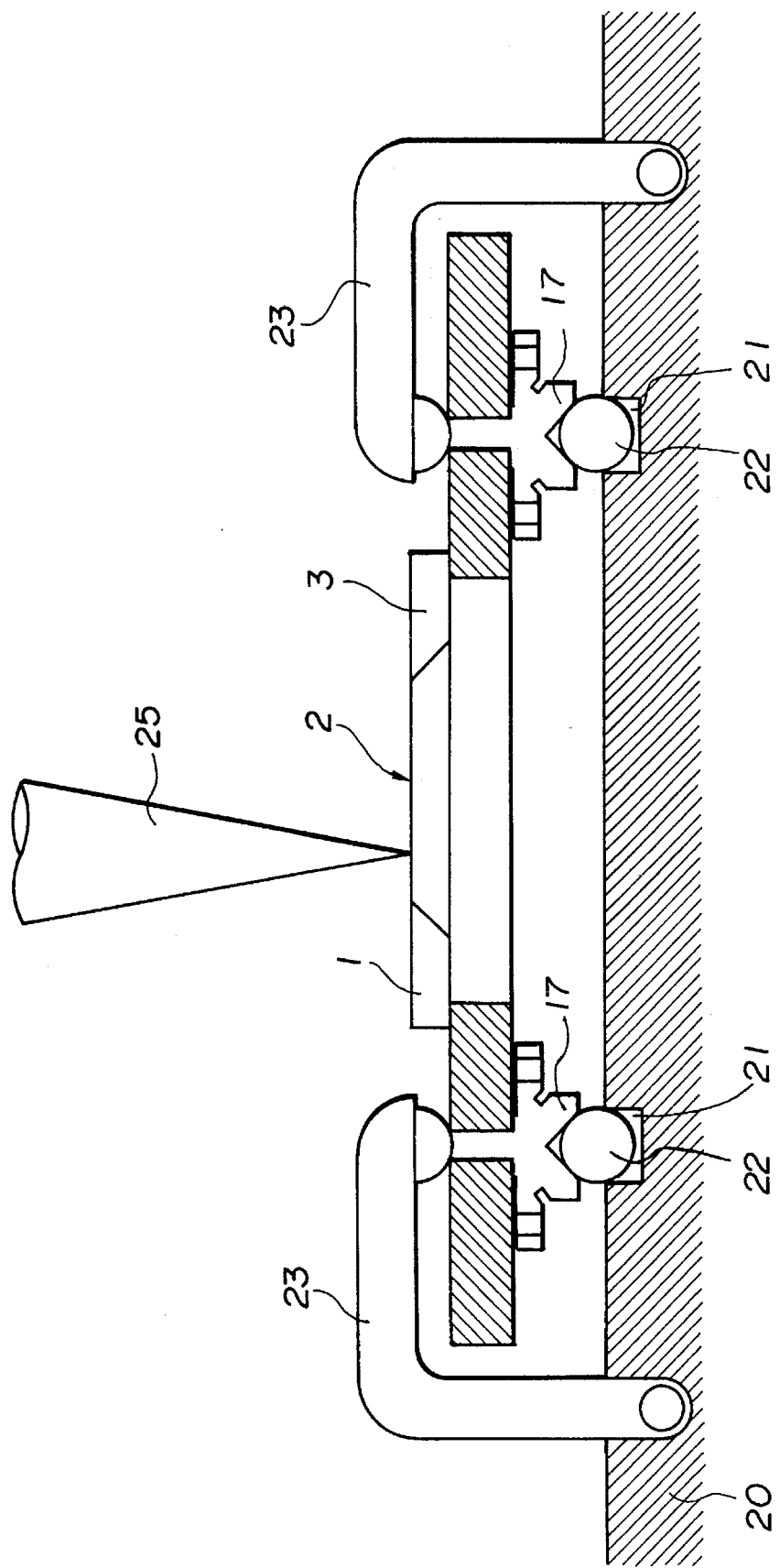
FIG. 5 is a diagram illustrating the configuration of an EB scanning apparatus according to the second embodiment.

Various modifications of the above-described embodiment will now be shown. FIGS. 4(a), 4(b) and 5 illustrate a second embodiment of the present invention. The configuration of the second embodiment differs from that of the first embodiment in that the magnetic rings are mounted on the mask via three intermediate members 17. In FIGS. 4(a), 4(b) and 5, components indicated by the same reference numerals as in the first embodiments are the same as the corresponding components in the first embodiments.

The intermediate members 17 differ from one another, and a conical-hole portion, a V-groove portion and a flat portion, which contact spheres provided on the chuck, are formed in the respective members 17. A mounting reference surface, which has been very precisely finished by grinding or the like, and four female-screw portions for mounting a magnetic ring 18 are provided on each of the intermediate members 17. Spot facings for screws are provided in the magnetic ring 18, so that the magnetic ring 18 can be screwed on the intermediate member 17 at four portions using screws 19, by threading them in the corresponding spot facings. The intermediate member 17 is made of a non-magnetic material, such as non-magnetic stainless steel or the like, and the magnetic ring 18 is made of magnetic stainless steel or the like. The screws of the magnetic ring 18 are provided at positions shifted from the yokes of the electromagnetic unit of the mask chuck which faces the intermediate member 17 when the mask is fixed in the X-ray exposure apparatus, so that the magnetic lines of force of the permanent magnet of the electromagnetic unit are not reduced.

As in the first embodiment, when fixing the X-ray mask in the EB scanning apparatus (see FIG. 5), the mask is mechanically clamped in a state in which the magnetic rings are absent on the mask. When fixing the X-ray mask in the X-ray exposure apparatus (see FIGS. 4(a) and 4(b)), the magnetic rings are mounted on the mask End the mask is clamped by a magnetic force. The position and the direction of the vector of the clamping force are identical in the above-described two cases.

The present embodiment has a feature in that the magnetic rings can be removed at any time. In the first embodiment, after the X-ray mask has been completed, the mask cannot be mounted again in an apparatus which uses an EB. In the present embodiment, however, since the magnetic rings are screwed, the mask can be mounted in an apparatus which uses an EB by removing the magnetic rings even after the mask has been completed. This is effective when measuring the patterning accuracy of the mask by an EB length-measuring apparatus or the like.

According to the present embodiment, even if distortion is generated in the vicinity of the magnetic rings caused by magnetic attraction when fixing the mask in the X-ray exposure apparatus, the distortion is absorbed by the intermediate members, so that the distortion is not transferred to the mask frame and the transfer pattern.

Third Embodiment

Figure 6A:
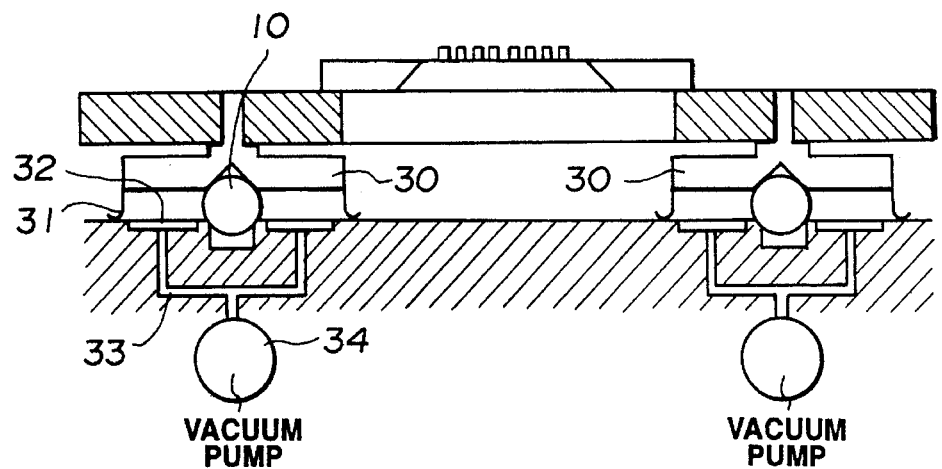
FIGS. 6(a) and 6(b) are diagrams illustrating the configuration of an X-ray exposure apparatus according to a third embodiment of the present invention.
Figure 6B:
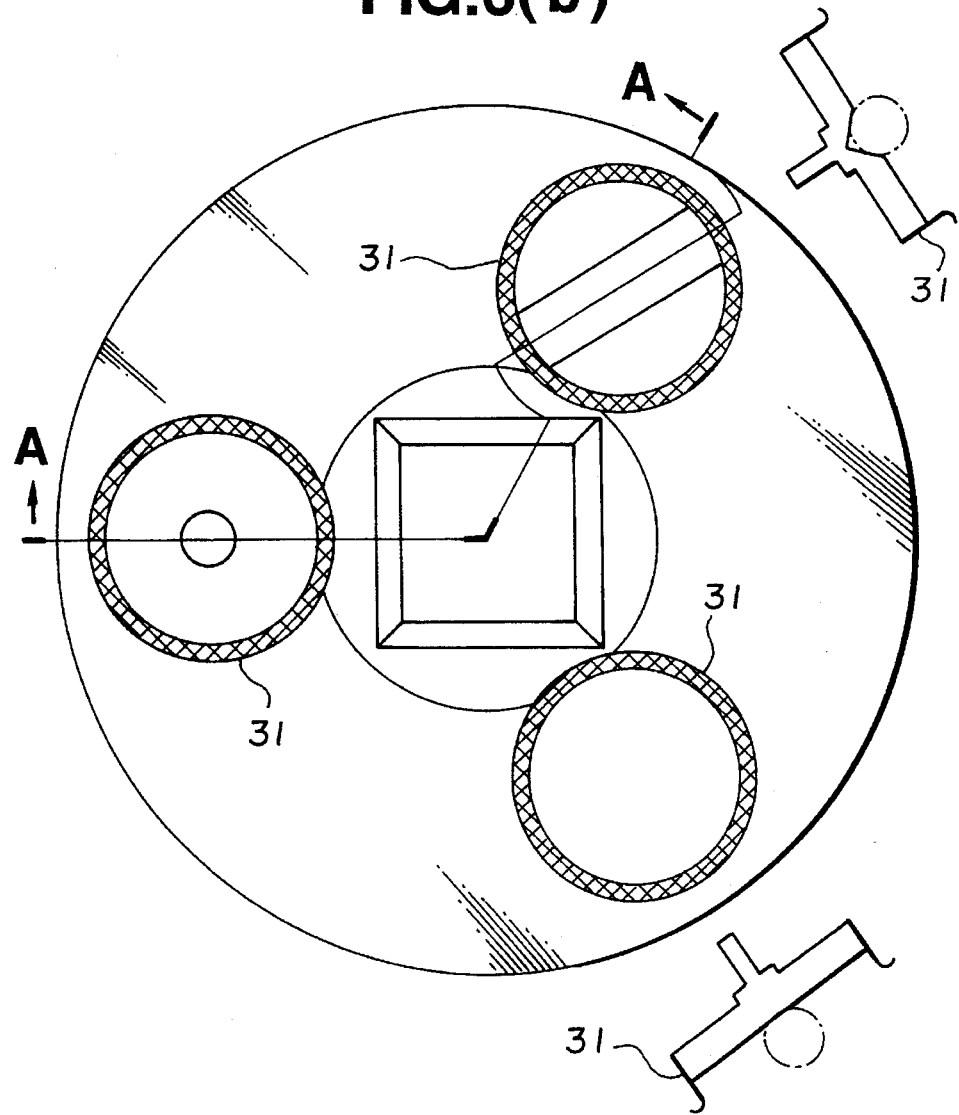
Figure 7:
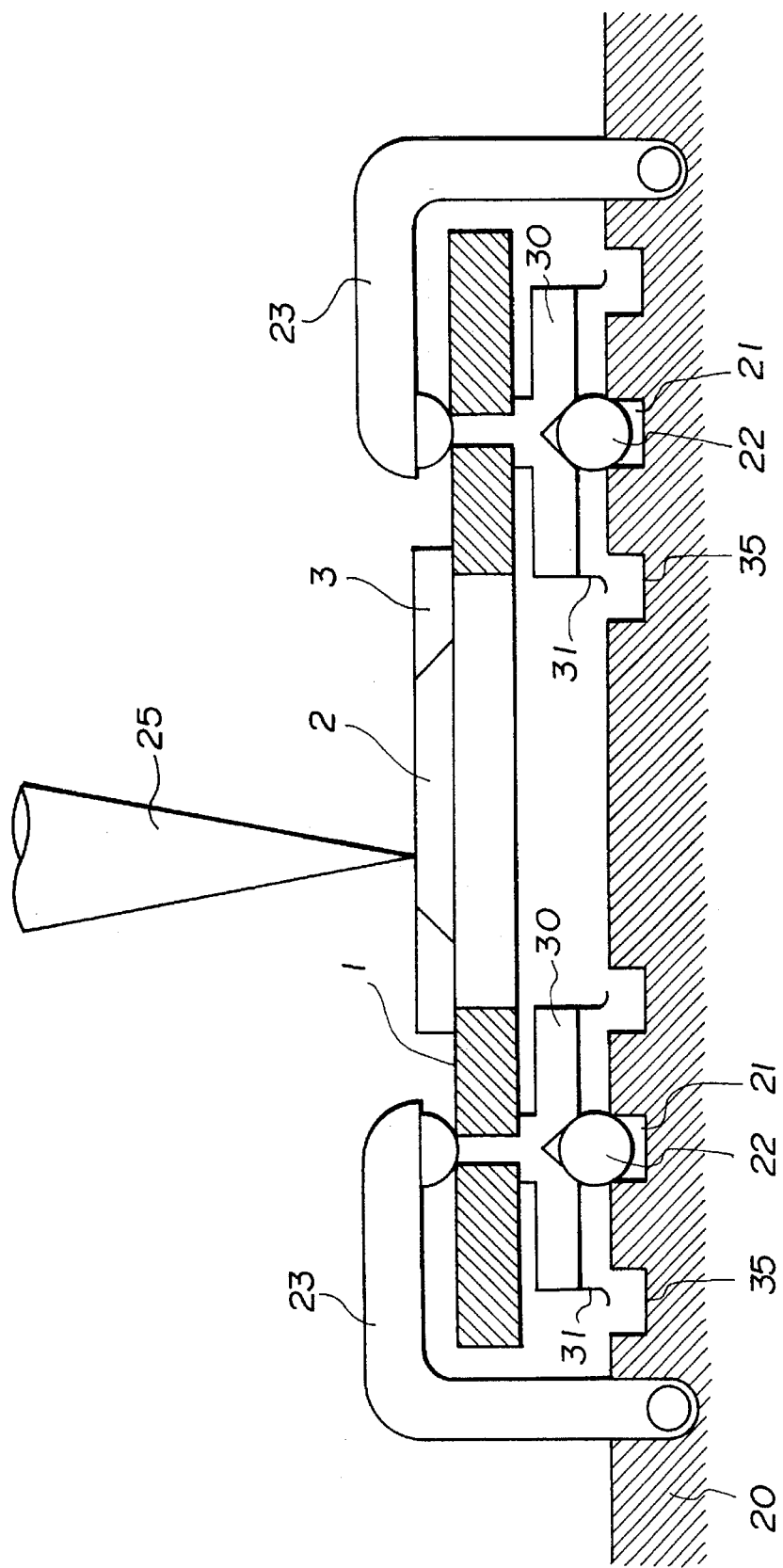
FIG. 7 is a diagram illustrating the configuration of an EB scanning apparatus according to the third embodiment.

FIGS. 6(a), 6(b) and 7 illustrate a third embodiment of the present invention. While the above-described embodiments use the magnetic attraction method, the present embodiment has a feature in that it adopts a vacuum attraction method. In FIGS. 6(a), 6(b) and 7, components having the same reference numerals as in the above-described embodiments are the same as the corresponding components in the above-described embodiments.

In FIGS. 6(a) and 6(b), three intermediate members 30 are mounted on the back of the masks frame 1 of the X-ray mask, and a conical-hole portion, a V-groove portion and a flat portion are formed in the back of each of the intermediate members 30 as in the case of FIGS. 4(a) and 4(b). A seal member 31 is fixed around each of the intermediate member 30s. Either a metallic material or a non-metallic material may be used for the intermediate members 30. A soft and airtight material is used for the seal member 31.

A ring-shaped vacuum-suction groove 32 is provided around each of the three spheres 10 fixed on the surface of the mask chuck of the X-ray exposure apparatus. The suction groove 32 is connected to a vacuum pump 34 via a path 33, so that the suction groove 32 is evacuated.

FIG. 7 is a diagram illustrating mounting of the mask in an EB scanning apparatus. The mask is mechanically clamped by the clamping arms 23 in the same manner as in the case of FIGS. 3 and 5. A clearance groove 35 is provided at each position, where the seal member 31 is present, on the surface of the mask chuck 20, in order to prevent formation of a vacuum region by the intermediate member 30, the seal member 31 and the chucking surface of the EB scanning apparatus.

A description will now be provided of procedures of mounting the X-ray mask manufactured by the EB scanning apparatus in the mask chuck of the X-ray exposure apparatus.

First, the suction grooves 32 are brought under an atmosphere to which the X-ray exposure apparatus is exposed, for example, a He atmosphere of 150 Torr. Then, the mask frame 1 is positioned so that the conical-hole portion, the V-groove portion and the flat portion provided in the respective intermediate members 30 contact the corresponding three spheres 10, using a mask hand not shown). After the positioning operation, the suction grooves 32 are evacuated by operating the vacuum pumps 34. A vacuum region is thereby formed at the circumference of each of the spheres 10 by the intermediate member 30, the seal member 31, and the surface of the mask chuck 20, and a pulling force to pull the intermediate member 30 toward the mask chuck is generated due to a differential pressure with respect to the pressure of the surrounding atmosphere. Thus, the X-ray mask is fixed making the three spheres 10 mechanical references. Since a sphere 10 is placed at the center of the ring-shaped vacuum suction groove 32, the vector of the pulling force applied to the intermediate member 30 passes through the center of the sphere 10 and is perpendicular to the pattern surface. Accordingly, as in the above-described embodiments, the mechanical references for positioning, the position and the direction of the vector of the holding force are identical when the X-ray mask is fixed on the X-ray exposure apparatus and when the X-ray mask is fixed on the EB scanning apparatus, so that the mask can be held and fixed in the same state. Accordingly, pattern distortion is not produced between EB scanning and X-ray exposure,i so that very precise exposure and transfer can be performed.

Fourth Embodiment

Figure 8:
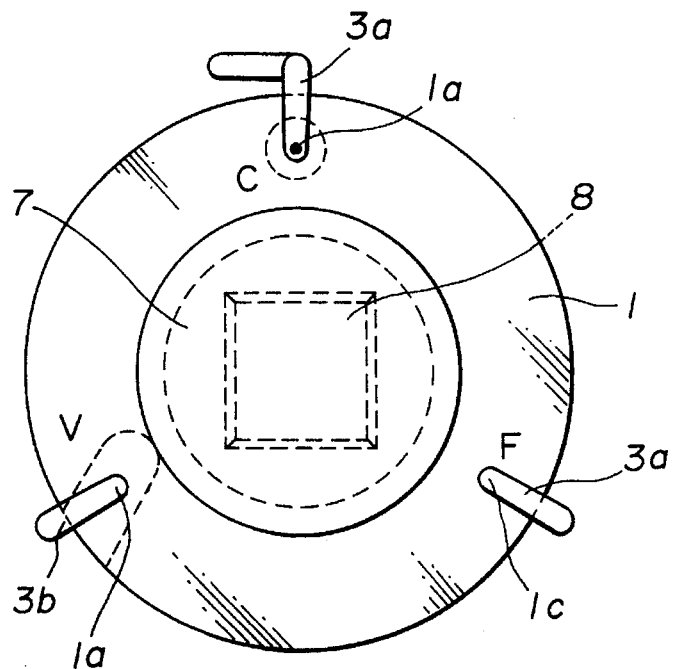
FIG. 8 is a diagram illustrating the configuration of a mask chuck according to a fourth embodiment of the present invention.
Figure 9:
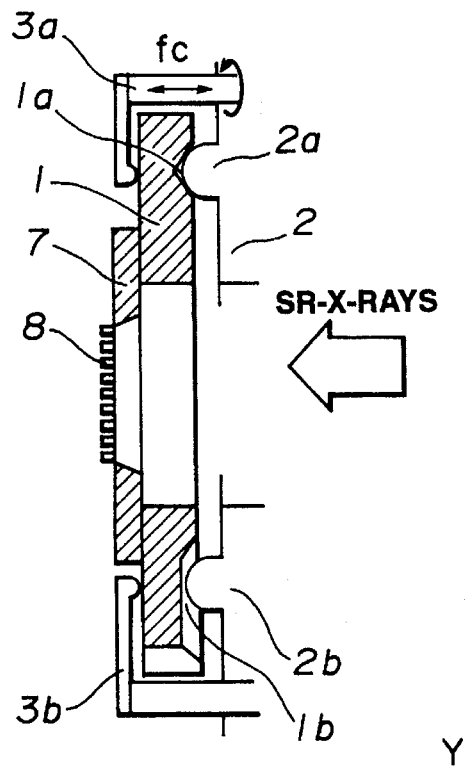
FIG. 9 is a cross-sectional view of the mask frame chuck shown in FIG. 8.
Figure 10:
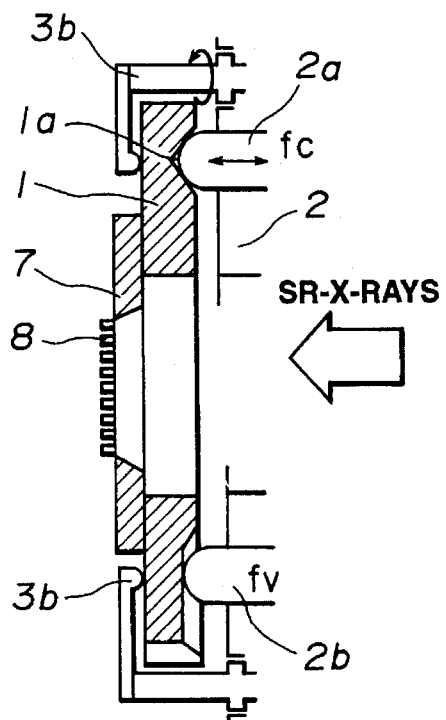
FIG. 10 is a cross-sectional view illustrating the configuration of a mask chuck according to a modification of the fourth embodiment.

Next, a description will be provided of a fourth embodiment of the present invention With reference to the drawings. FIG. 8 is a diagram illustrating the configuration of a mask chuck according to the fourth embodiment. FIG. 9 is a cross-sectional view of the mask chuck shown in FIG. 8, and illustrates a state in which a mask is vertically held against the force of gravity. A silicon mask substrate 7 is bonded on a ring-shaped mask frame 1, and a membrane, on which a transfer pattern 8 made of gold or the like is formed, is provided on the inner side of the mask substrate 7. (1) A conical-hole portion 1a, (2) a linear V-groove portion 1b, whose edge line is in the direction of the conical-hole portion 1a, and (3) a flat portion 1c are provided at three portions on the back of the mask frame 1. These portions are provided on the same circumference of a circle, whose center equals the center of the mask, with an equal interval (with a pitch of 120°). Projections 2a–2c, each having a semispherical distal-end portion, are provided at three portions on the mask chuck 2, so as to face and engage with the conical-hole portion 1a, the V-groove portion 1b and the flat portion 1c. Three clamp arms 3a–3c are also provided. Each of the clamp arms 3a–3c can rotate and linearly move, so that the mask frame 1 is grasped by the clamp arms 3a–3c and the projections 2a–2c of the mask chuck 2. As a modification, the configuration shown in FIG. 10 may be adopted, in which projections 2a–2c independently protrude instead of the linear movement of the clamp arms 3a–3c, and the clamp arms 3a–3c only rotate.

A description will now be provided of operation procedures in the present embodiment. When the mask has been conveyed onto the surface of the mask chuck 2 by a mask hand (not shown), the clamp arms 3a–3c rotate so as to hold the mask, and then slightly move toward the mask chuck 2 to grasp the mask frame 1 on the mask chuck 2. In this state, since the distance between each combination of the semispherical projections 2a and 2b and the clamp arms 3a and 3b is less than the thickness T of the mask frame 1 at the conical-hole portion 1a and the V-groove portion 1b (see FIG. 11), the mask is suspended by being supported by the projections at the above-described two portions, and is prevented from dropping. The mask is not strongly pressed, but can more or less move.

Thereafter, only the clamp arm 3a is further moved toward the mask chuck, so that the conical-hole portion 1a and the projection 2a engaging with each other are pressed against each other, as shown in FIG. 9. Three degrees of freedom (X, Y, Z) are thereby fixed. At that time, the distal end of the projection 2a and the distal end of the clamp arm 3a exactly face each other. If the conical-hole portion 1a is not exactly positioned as shown in FIG. 11, a moment force is generated in the mask frame 1 due to an amount of eccentricity $\delta_c$, thereby causing pattern distortion.

Thereafter, by further drawing the clamp arm 3b, the V-groove portion 1b and the projection 2b are pressed against each other. Two degrees of freedom ($\theta_Z$, $\theta_Y$) in the direction of rotation of the mask are thereby fixed. Finally, by drawing the remaining clamp arm 3c, the flat portion 1c and the projection 2c are pressed against each other, to fix the remaining degree of freedom ($\theta_X$). Thus, the six degrees of freedom of the mask are positioned and fixed without being excessively constrained.

Figure 11:
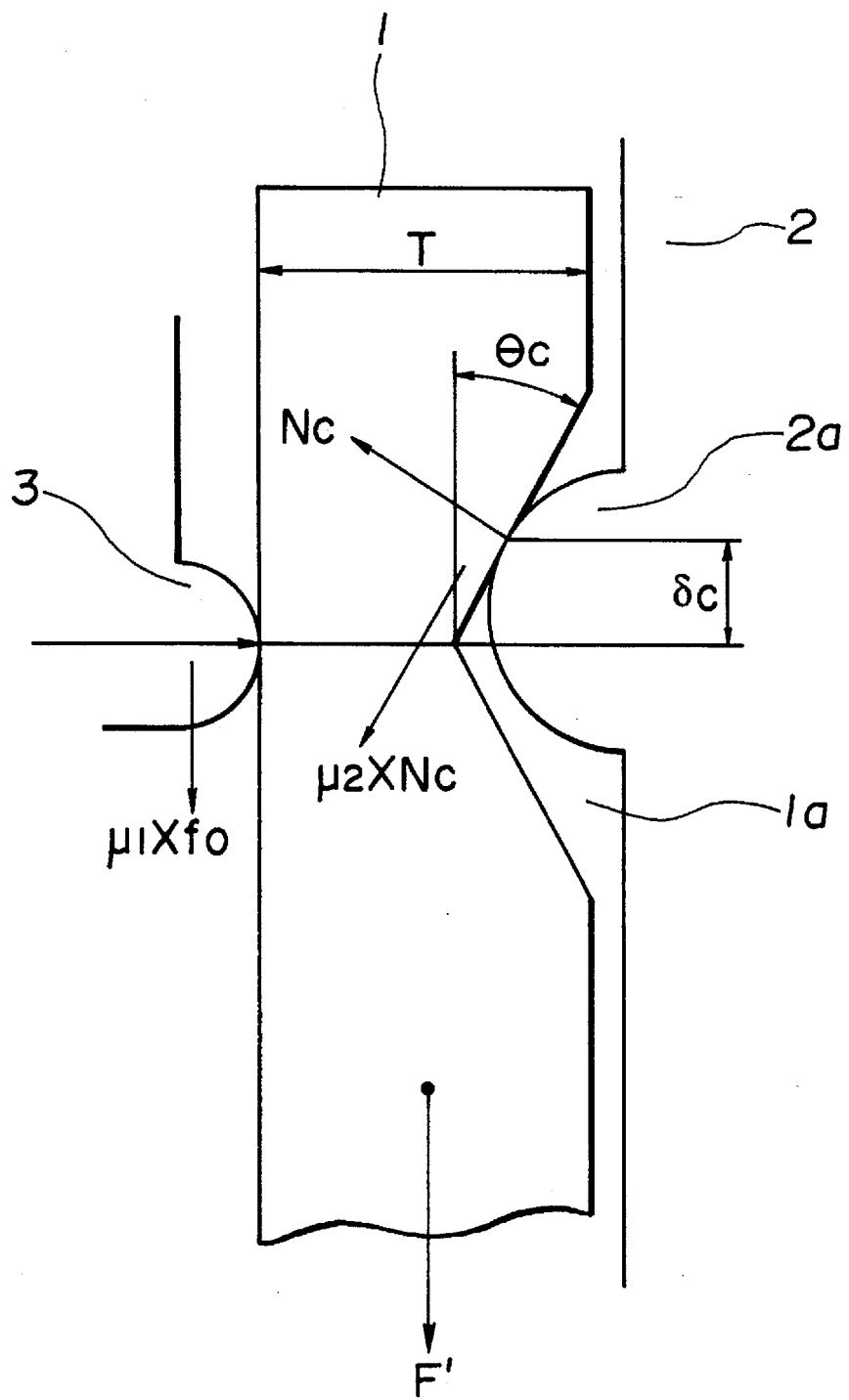
FIG. 11 is a diagram illustrating forces applied to a conical-hole portion.
Figure 12:
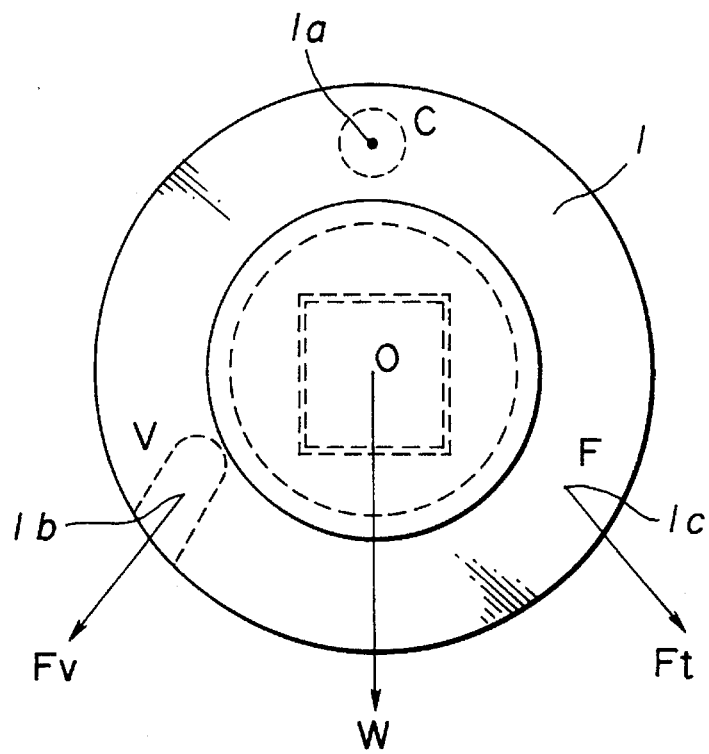
FIG. 12 is a diagram illustrating forces applied to a mask when the conical-hole portion is positioned on the center-of-gravity line of the mask.

FIG. 11 illustrates the relationship between forces applied to the conical-hole portion 1a of the mask in a state in which the mask is supported at the conical-hole portion 1a. A condition, necessary for positioning and fixing the mask by the conical-hole portion 1a by a pressing force $f_C$ applied to the conical-hole portion 1a in a state in which the V-groove portion 1b and the flat portion 1c are not fixed, will now be obtained. A severe case as shown in FIG. 12, i.e., a case in which the conical-hole portion 1a is present on the center-of-gravity line of the mask, will be considered. If the angle of the groove of the conical-hole portion 1a with respect to a plane parallel to the plane of the mask is represented by $\theta_C$, a force F exerting in the direction of gravity comprises the weight W of the mask and a frictional force caused by the force $f_C$ of the clamp arm, and is therefore expressed by:

$$F = W + \mu_1 \times f_C \quad (1),$$

where $\mu_1$ is the coefficient of friction between the clamp arm and the mask. From the balance of forces, a vertical drag exerting in the direction of the conical-hole portion 1a is expressed by:

$$\text{vertical drag } N_C = f_C \times \cos \theta_C + F \times \sin \theta_C \quad (2).$$

A frictional force exerting on the conical-hole portion 1a is expressed by:

$$\text{frictional force} = \mu_2 \times N_C \quad (3),$$

where $\mu_2$ is the coefficient of friction between the projection and the mask.

In order to position and fix the mask against the frictional force, a pulling force must satisfy the following condition:

$$\text{pulling force} = f_C \times \sin \theta_C - F \times \cos \theta_C \geq \mu_2 \times (f_C \times \cos \theta_C + F \times \sin \theta_C) \quad (4).$$

When the three degrees of freedom (X, Y, Z) have been first positioned at the conical-hole portion 1a, it is preferable to thereafter position the V-groove portion 1b. If the flat portion 1c is positioned before the V-groove portion 1b, a frictional force with the plane of the flat portion 1b is added when finally positioning the V-groove portion 1b, and therefore a greater force is required for positioning.

Similarly, a condition for positioning by the V-groove portion 1b is expressed by expression (4) in which $\theta_C$ is replaced by the angle of the groove $\theta_V$ of the V-groove portion 1b with respect to a plane parallel to the plane of the mask, and fc is replaced by $f_V$, using the value F obtained from the following expression:

$$F = \mu_1 \times f_V \quad (5),$$

which is obtained by making W=0 in expression (1), and replacing $f_C$ by $f_V$.

Figure 13:
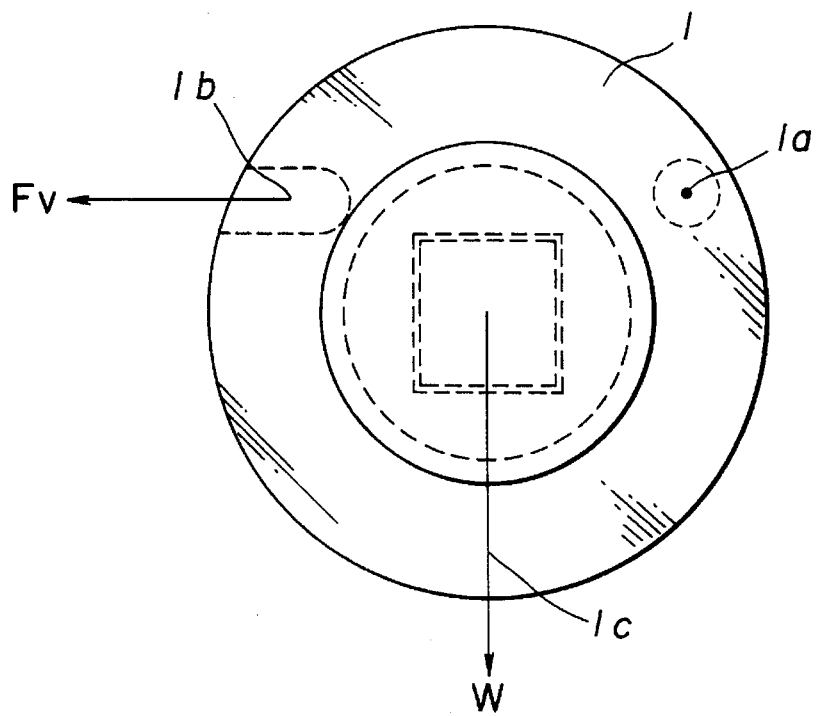
FIG. 13 is a diagram illustrating forces applied to the mask when the conical-hole portion and a V-groove portion are provided horizontally with respect to the center of gravity line of the mask.

As a modification, in a state shown in FIG. 13, i.e., when the conical-hole portion 1a and the V-groove portion 1b are arranged orthogonal to the direction of the force of gravity, W in expression (1) is replaced by:

$$W=\{(W/2)^2+F^2\}^{1/2},$$

where $$F'=\mu_1 \times W/(2 \sin \theta_V)+\mu_2 \times W \cos \theta_V/(2 \sin \theta_V) \quad (1').$$

A condition for positioning by the V-groove portion 1b is given by expression (4), using the value F obtained by replacing W by W'=W/2.

As still another modification, When the V-groove portion 1b is present on the line of the center of gravity of the mask, W in expression (1) is replaced by $$W'=\mu_1 \times W/(2 \sin \theta_V)+\mu_2 \times W \cos \theta_V/(2 \sin \theta_V)+3/2W,$$

and a condition for positioning by the V-groove portion 1b is given by expression (4).

Figure 17:
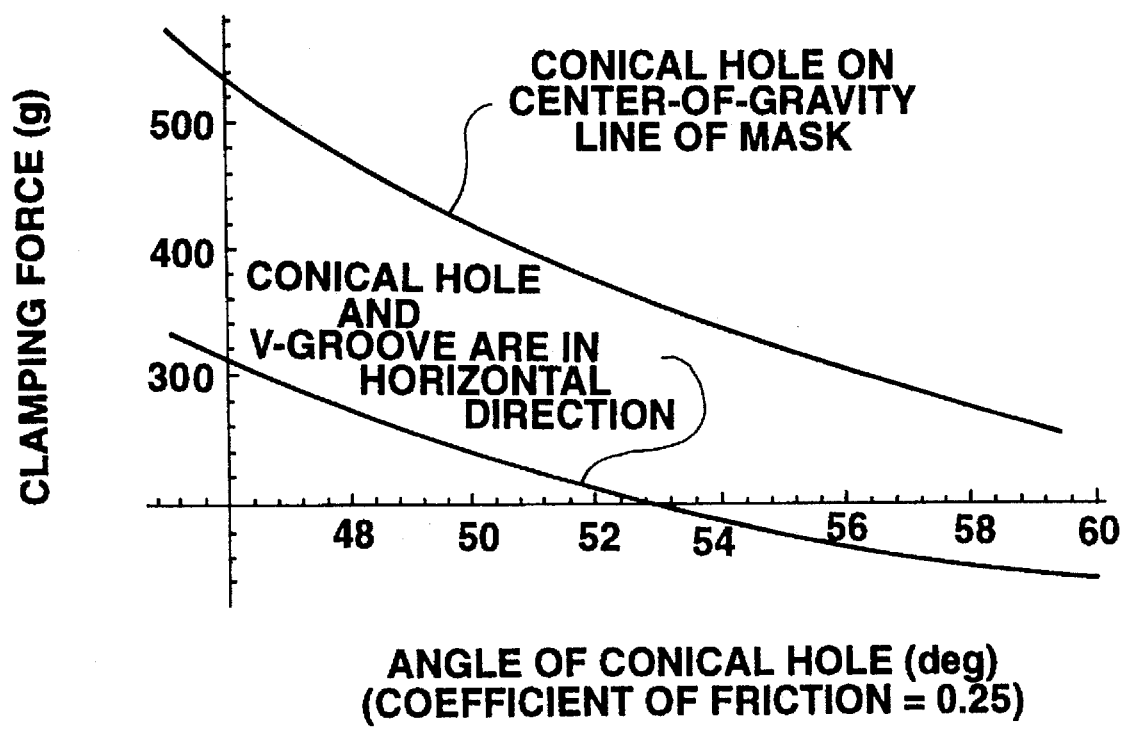
FIG. 17 is a graph indicating a clamping force necessary when it is intended to position a mask only by a conical-hole portion.

FIG. 17 illustrates results obtained when the mask's own weight W=200 g, $\mu_1=\mu_2$, and $\theta_V=\theta_C$. The abscissa represents the angle (deg) of the conical-hole portion 1a, and the ordinate represents a pressing force necessary at the conical-hole portion 1a. As for the conical-hole portion 1a, it can be said that positioning can be more easily performed by a configuration in which the conical-hole portion 1a and the V-groove portion 1b are arranged horizontally with respect to the direction of the force of gravity (i.e., the configuration shown in FIG. 13).

Fifth Embodiment

In the above-described embodiment, the mask is fixed by pressing the conical-hole portion, the V-groove portion and the flat portion of the mask frame in this order. A description will now be provided of another approach according to a fifth embodiment of the present invention.

A condition for enabling positioning by the conical-hole portion 1a against forces generated at the V-groove portion 1b and the flat portion 1c when positioning is first performed by the V-groove portion 1b and the flat portion 1c will now be obtained. FIG. 12 illustrates forces generated at the conical-hole portion 1a and the mask. From FIG. 12, as for the V-groove portion 1b:

$$\text{vector } F_V=\mu_1 \times f_V+\mu_2 \times f_V/\cos \theta_V \quad (6).$$

As for the flat portion 1c:

$$\text{vector } F_F=\mu_1 \times f_F+\mu_2 \times f_F \quad (7).$$

Hence, the vector synthesis of the two forces is expressed by:

$$\text{vector } F=\text{vector}F_V+\text{vector}F_F+\text{vector}W.$$

For the purpose of simplification, it is assumed that W=0. It is thereby possible to use expression (2) irrespective of the direction of the vector W, in other words, irrespective of the positions of the conical-hole portion 1a and the V-groove portion 1b.

$$F'=F_V \cos \alpha+F_F \cos(60°-\alpha) \quad (8),$$

where the angle made by the three points F, C and V equals 60°, and $\tan\alpha=3/2F_F/(F_V+½F_F)$.

$$F=F'+\mu_1 \times f_C \quad (9).$$

A condition for positioning is expressed by expression (4) after substituting expression (9) in expression (1).

Figure 18:
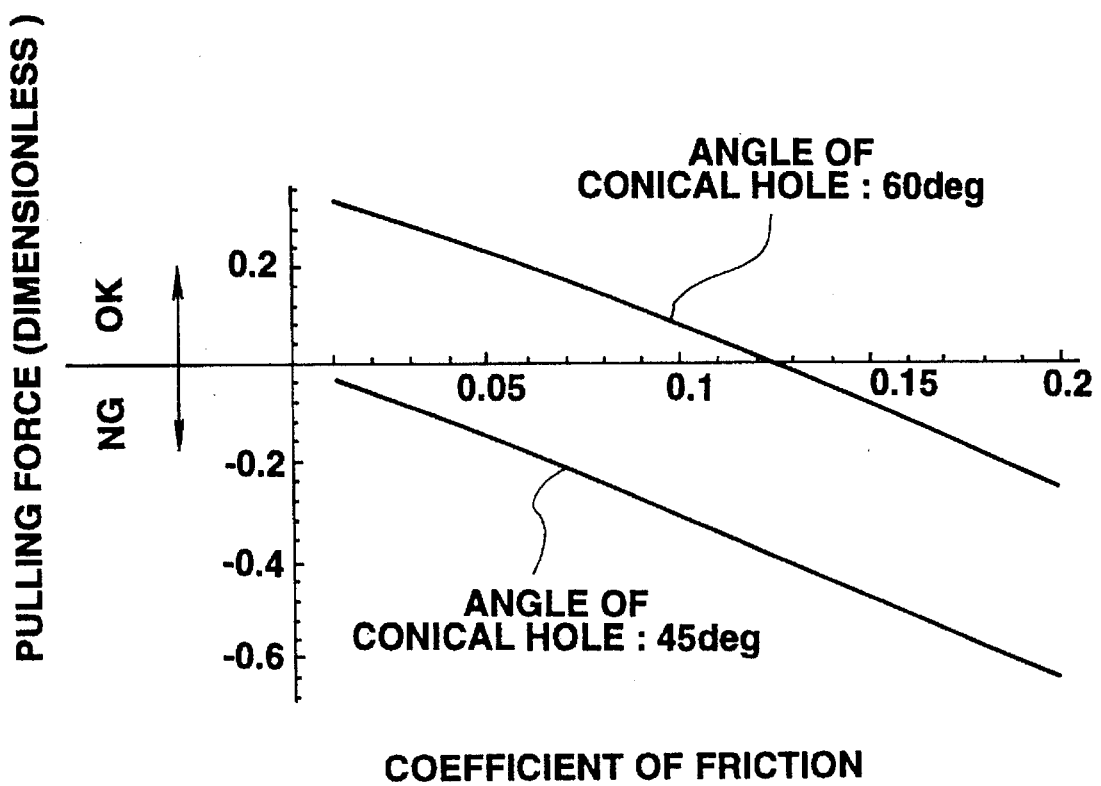
FIG. 18 is a graph indicating a pulling force necessary when clamping a mask simultaneously at three positions.

FIG. 18 illustrates the results of calculations in the case of $\mu_1=\mu_2$, $\theta_V=\theta_C$, and $f_C=f_V=f_F$. The abscissa represents the coefficient of friction, and the ordinate represents a pulling force necessary for positioning a deviated mask by the conical-hole portion (dimensionless in units of $f_C$). Positioning cannot be performed in the range of negative pulling forces. In order to perform positioning, a coefficient of friction equal to or less than 0.12 is required even if the angle of the conical-hole portion 1a $\theta_C=60°$. Taking into consideration the mask's own weight, exact positioning is difficult in this state.

In order to realize exact positioning, the pressing force of the conical-hole portion 1a is maximized, and the pressing forces of the other two portions are weakened. The minimum force necessary to constrain the out-of-plane direction is sufficient as the force applied to the flat portion. A force greater than this force causes an unnecessary frictional force. Accordingly, it is most preferable to arrange the forces so that $F_C$ (the conical-hole portion)$>F_V$ (the V-groove portion)$>F_F$ (the flat portion).

Alternatively, the relationship between the angle $\theta_C$ of the conical-hole portion and the angle $\theta_V$ of the V-groove portion may be arranged to be $\theta_C>\theta_V$, so that expression (4) is satisfied after substituting expression (9) in expression (2).

Sixth Embodiment

In approaches other than the above-described approaches, the coefficient of friction $\mu_1$ or the mask's own weight W is reduced. A specific example of reducing the coefficient of friction $\mu_1$ according to a sixth embodiment of the present invention will now be described. In this embodiment, the frictional resistance of the clamping arms is reduced. A condition for positioning Can be obtained by substituting expressions (1), (6) and (7), in which it is assumed $\mu_1=0$, in expression (2).

Figure 19:
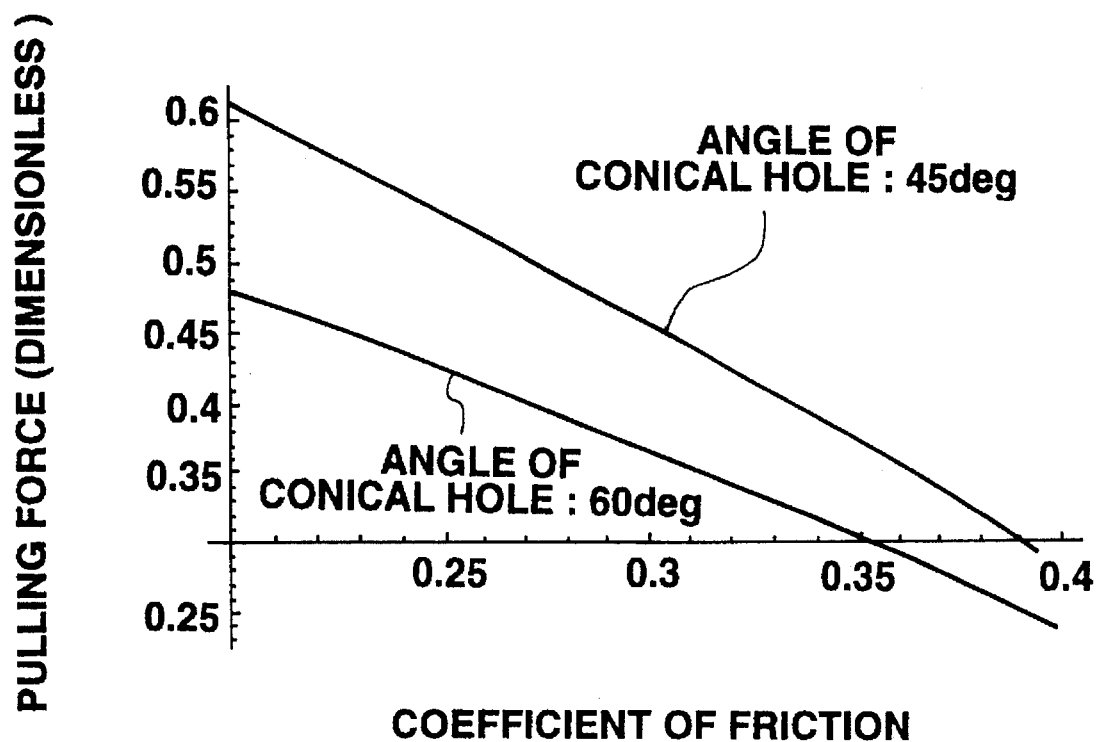
FIG. 19 is a graph indicating a pulling force necessary when the frictional force between a clamp arm and a mask equal 0.

FIG. 19 illustrates the results of such calculations. In FIG. 19, the abscissa represents the coefficient of friction, and the ordinate represents a pulling force necessary for positioning the mask (dimensionless in units of $f_C$). Positioning cannot be performed in the negative range of the ordinate. Although for the purpose of simplication, the influence of the mask's own weight is not considered in FIG. 19, it can be understood that the effect of reduction of the friction is great compared with the case of FIG. 18. The mask's own weight can be made 0 by using a weight compensation spring.

Figure 14:
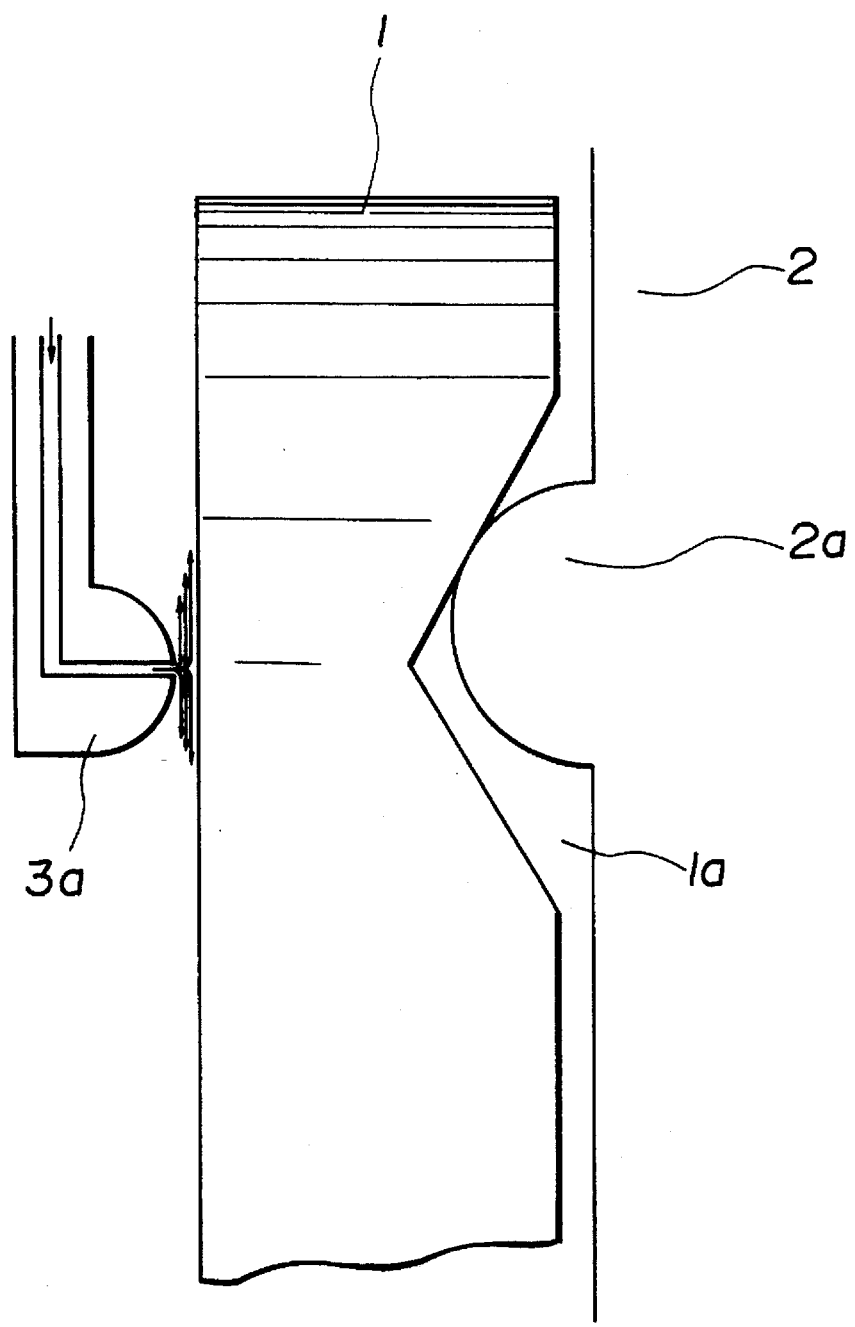
FIG. 14 is a diagram illustrating a case of ejecting air from the distal end of a clamp arm according to a sixth embodiment of the present invention.

FIG. 14 illustrates a specific configuration for reducing the frictional resistance of the clamp arms. By ejecting air from the distal end of the clamp arm, the coefficient of friction at the contact point between the mask frame 1 and the distal end of the clamp arm is reduced. Upon completion of positioning, the ejection of air is stopped so as to clamp the mask frame 1 in a state of solid contact.

Seventh Embodiment

Figure 15:
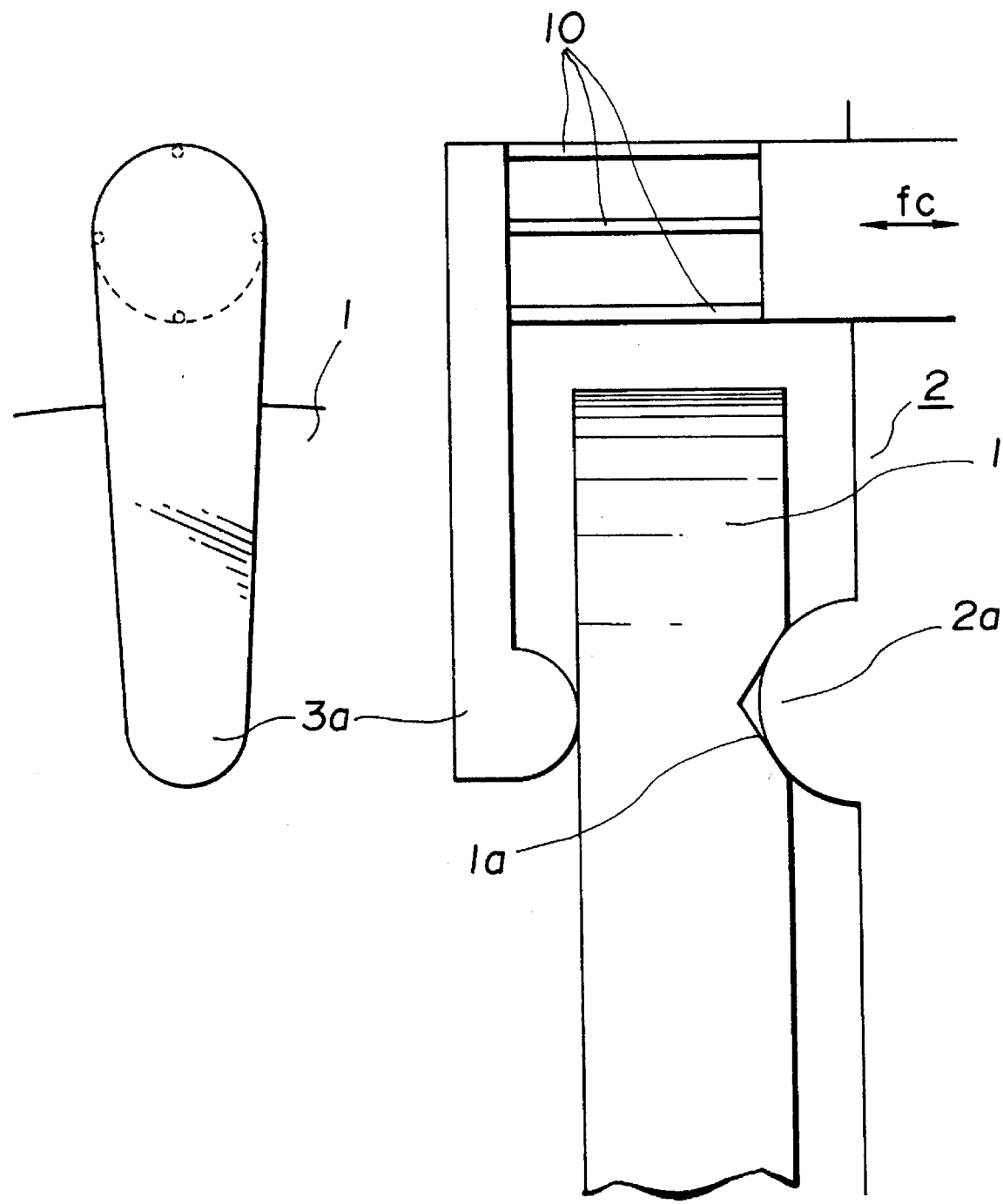
FIG. 15 is a diagram illustrating a clamp arm which utilizes a spring material, whose stiffness is high in a pressing direction and low in a lateral direction, according to a seventh embodiment of the present invention.

FIG. 15 illustrates a case in which a spring material whose rigidity is high in the direction of pressing the mask against the mask chuck, and is low in a lateral direction orthogonal to the above-described direction is utilized for the clamp arms, according to a seventh embodiment of the present invention. The clamp arm is supported by a plurality of parallel bar springs 10. Since the springs are bent when the mask frame is pressed, the same effect as reducing the coefficient of friction $\mu_1$ is obtained.

Eighth Embodiment

Figure 16:
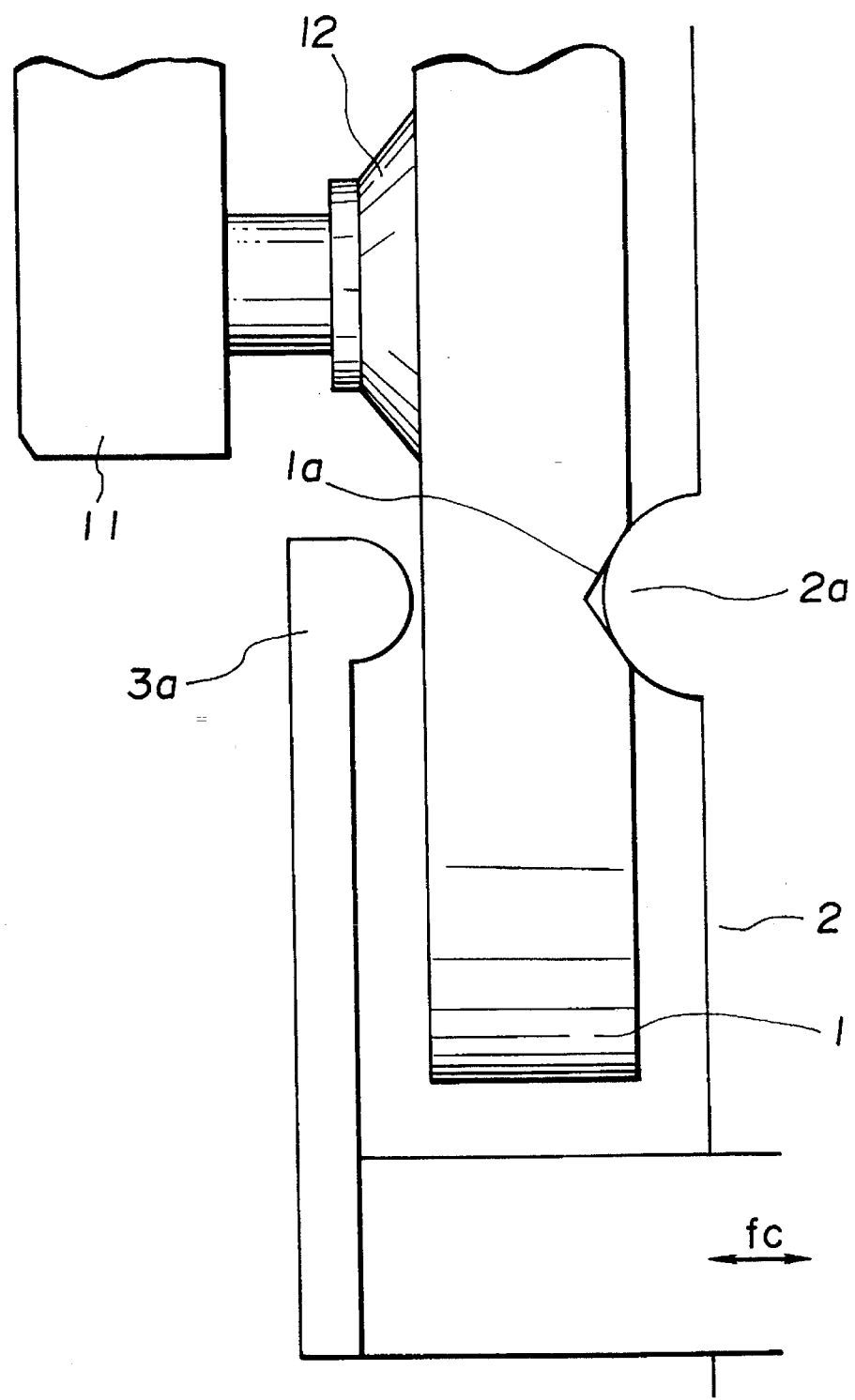
FIG. 16 is a diagram illustrating a case of determining a pressed position of a mask by a mask hand according to an eighth embodiment of the present invention.

Next, a description will be provided of a specific example for reducing W according to an eighth embodiment of the present invention. FIG. 16 is a diagram illustrating a state in which a mask is conveyed onto the holding surface of a mask chuck 2 using a mask hand 11, and the mask is pressed by the mask hand 11. A clamp arm 3, which has been retracted in order to facilitate mounting of the mask, catches the mask when the mask is pressed, so as to prevent the mask from dropping. Reference numeral 12 represents an attraction pad of the mask hand 11. Upon completion of positioning of the mask with respect to the mask chuck 2 by the mask hand 11, the mask is fixed by the clamp arm 3. Since the mask is supported by the mask hand 11, the mask's own weight W is substantially 0.

Ninth Embodiment

Next, a description will be provided of an exposure apparatus for manufacturing minute devices (semiconductor devices, thin-film magnetic heads, micromachines and the like) using the above-described mask and mask chuck, according to a ninth embodiment of the present invention.

Figure 20:
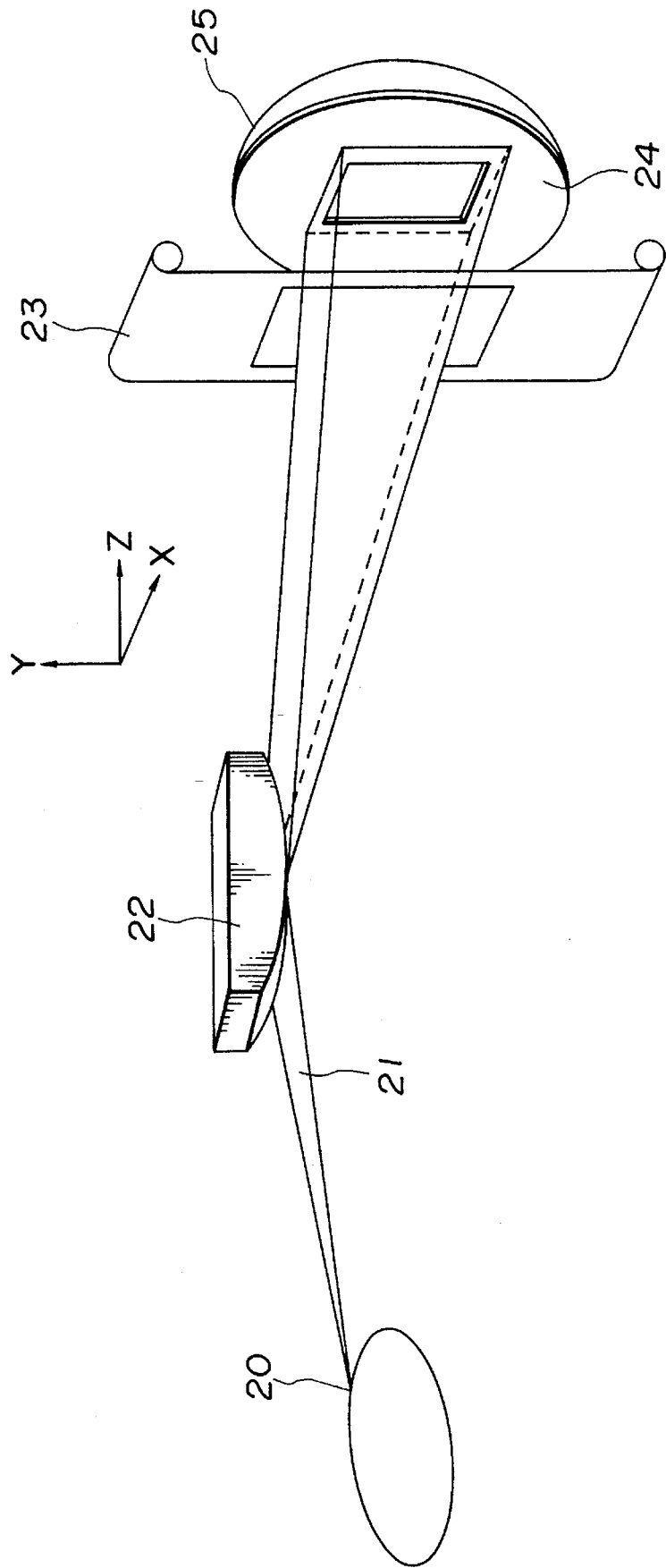
FIG. 20 is a schematic diagram illustrating the configuration of an X-ray exposure apparatus according to a ninth embodiment of the present invention.

FIG. 20 is a diagram illustrating the configuration of an X-ray exposure apparatus of the present embodiment. In FIG. 20, synchrotron-radiation light 21 having the shape of a sheet beam emitted from an SR (synchrotron radiation) source 20 is widened in a direction perpendicular to the orbital plane of the radiation light by a convex mirror 22. The radiation light reflected and widened by the convex mirror 22 is adjusted so as to provide a uniform exposure amount within an irradiated region by a shutter 23. The radiation light passing through the shutter 23 is guided to an X-ray mask 24. The X-ray mask 24 is held on a mask chuck (not shown) by the above-described mounting method. An exposure pattern formed on the X-ray mask 24 is exposed and transferred onto a wafer 25 by a step-and-repeat method, a scanning method or the like.

Figure 21:
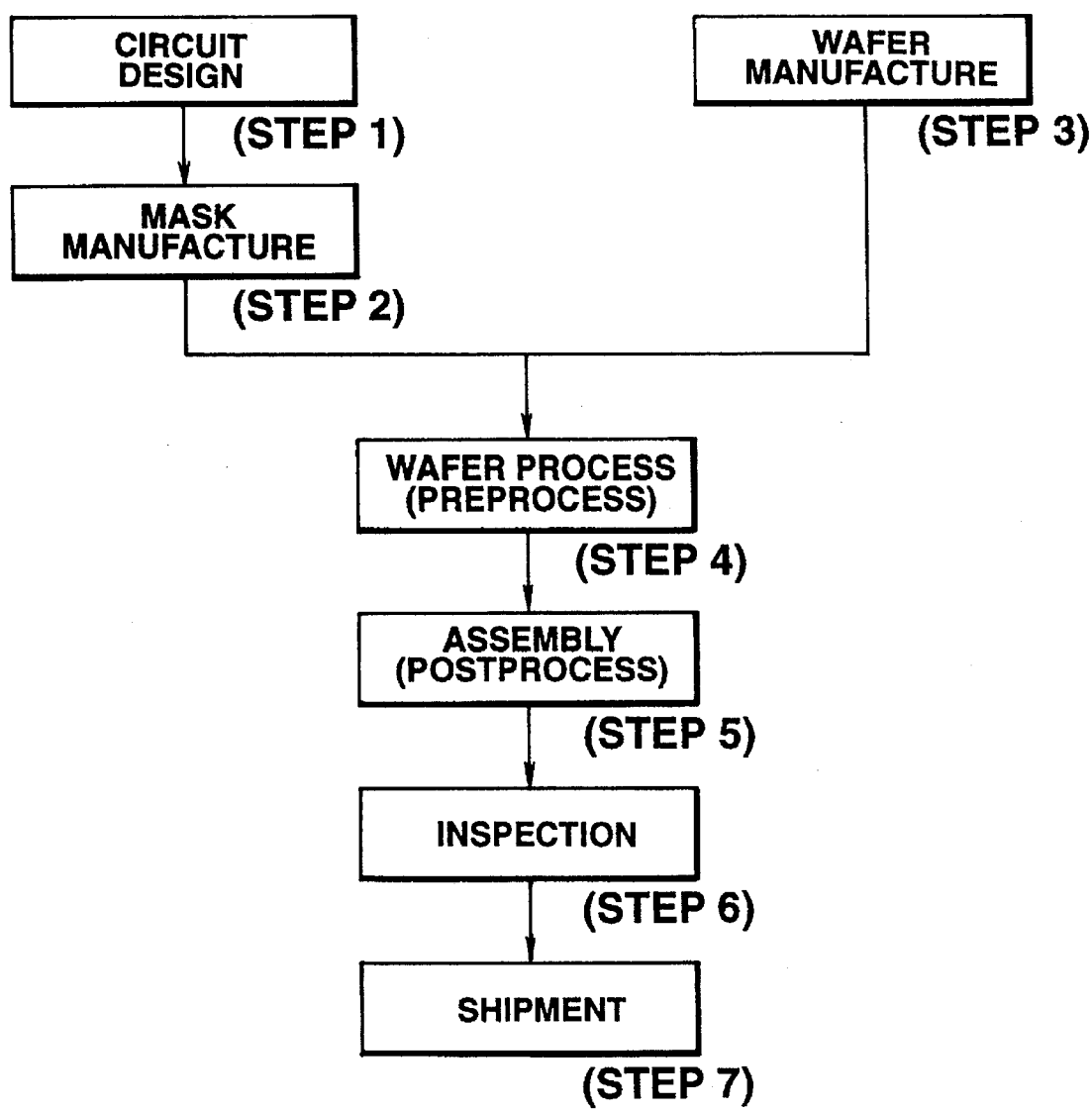
FIG. 21 is a diagram illustrating a flowchart of a device manufacturing method.

Next, a description will be provided of a device manufacturing method utilizing the above-described exposure apparatus. FIG. 21 shows a flowchart for manufacturing minute devices (semiconductor chips of IC's (integrated circuits), LSI's (large-scale integrated circuits) or the like, liquid-crystal panels, CCD's (charge-coupled devices), thin-film magnetic heads, micromachines, or the like).

In step 1 (circuit design), circuit design of semiconductor devices is performed. In step 2 (mask manufacture), masks on which designed circuit patterns are formed are manufactured. In step 3 (wafer manufacture), wafers are manufactured using a material, such as silicon or the like. Step 4 (wafer process) is called a preprocess, in which actual circuits are formed on the wafers by means of photolithography using the above-described masks and wafers. The next step 5 (assembly process) is called a postprocess which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after passing through the above-described processes, and the manufactured devices are shipped (step 7).

Figure 22:
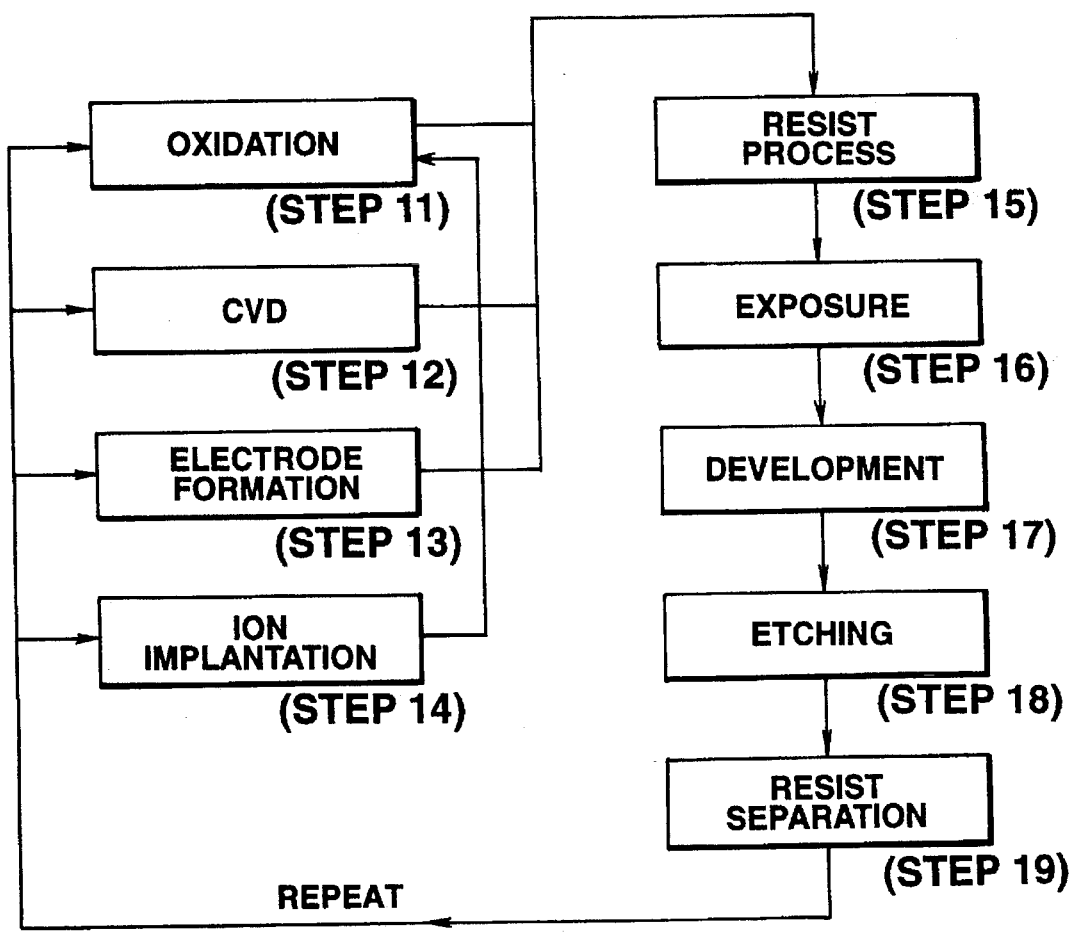
FIG. 22 is a diagram illustrating a detailed flowchart of a wafer process.
Figure 23:
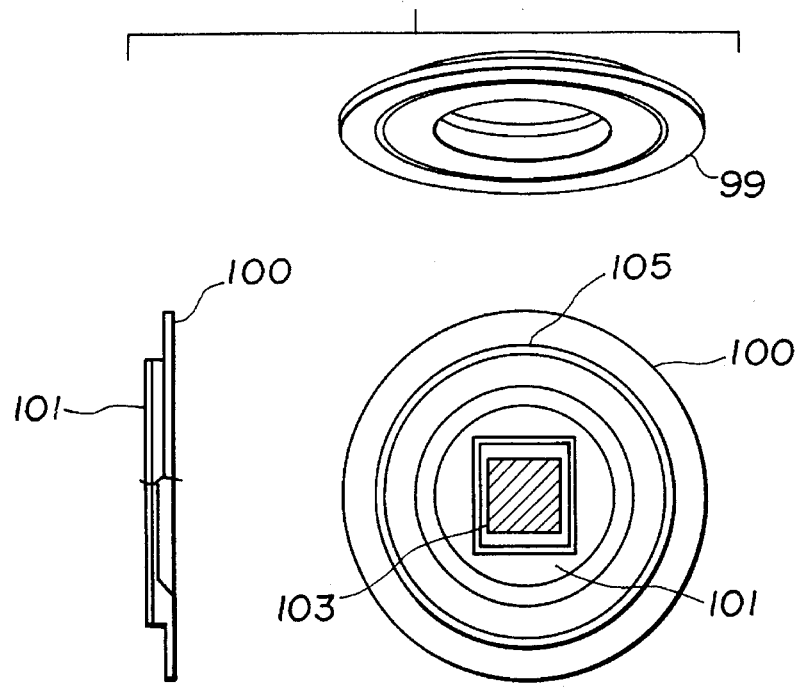
FIGS. 23(a) and 23(b) are diagrams illustrating a conventional magnetic-attraction-type mask chuck.
Figure 23:
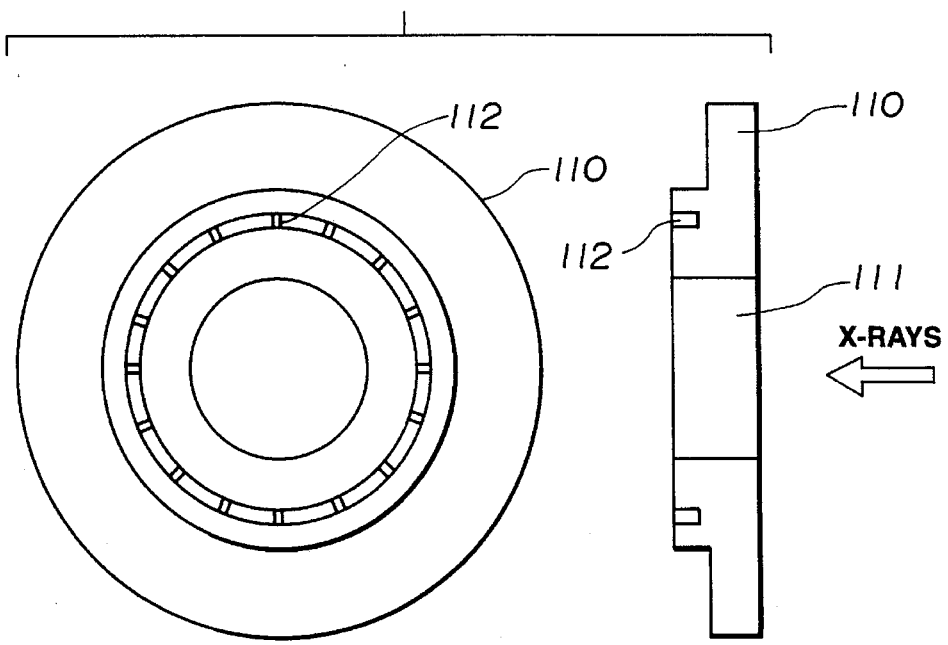
Figure 24:
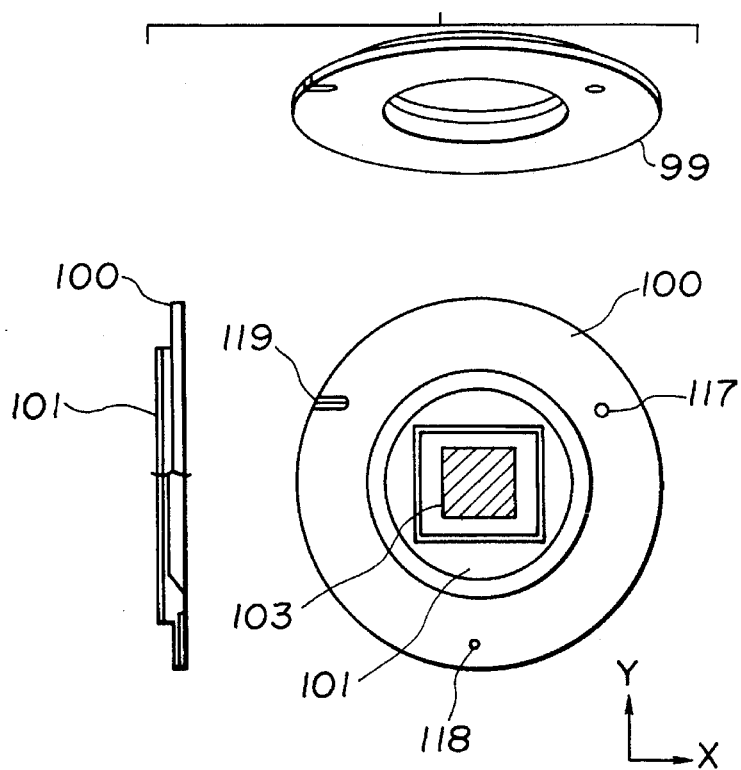
FIGS. 24(a) and 24(b) are diagrams illustrating a conventional kinematic-mounting-type mask chuck.
Figure 24:
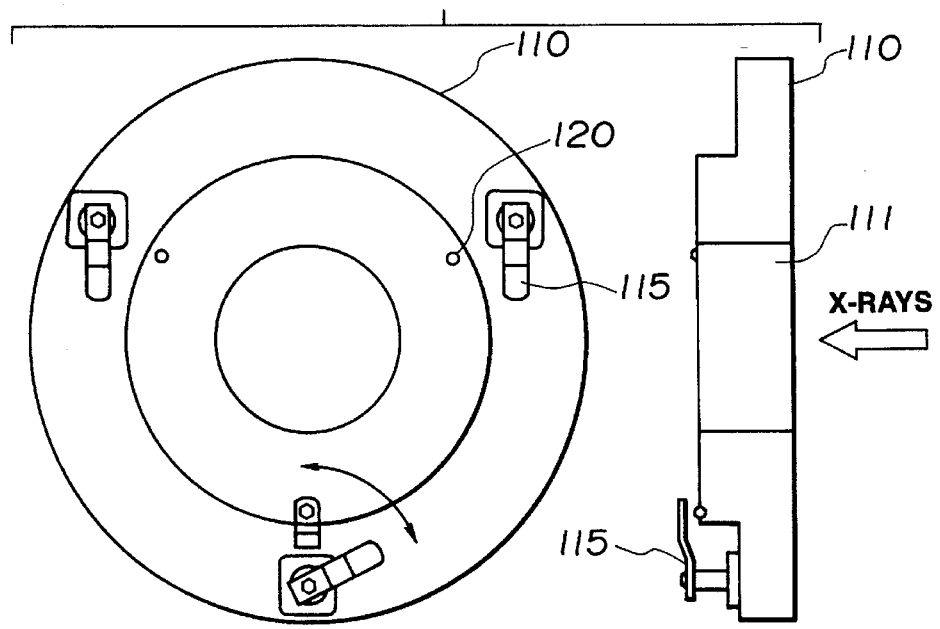

FIG. 22 shows a detailed flowchart of the above-described wafer process. In step 11 (Oxidation), the surface of the wafer is oxidized. In step 12 (CVD (chemical vapor deposition), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer by the above-described X-ray exposure apparatus. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern made of multiple patterns is formed on the wafer. By using the manufacturing method of the present embodiment, it is possible to manufacture semiconductor devices with a high degree of integration which have previously been difficult to manufacture.

The individual components shown in outline or designated by blocks in the drawings are all well known in the mask holding device, exposure apparatus and device manufacturing method arts and their specific construction and operation are not critical to the operation or the best mode for carrying out the invention.

While the present invention has been described with respect to what is presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mask holding device comprising:

a holding surface for supporting a mask at three positions, wherein the mask includes a conical-hole portion, a V-groove portion and flat portion; and force generation means, provided at positions corresponding to the three positions, for generating a non-mechanical force to pull the mask toward said holding surface.

2. A device according to claim 1, wherein said force generation means comprises a magnetic attraction mechanism.

3. A device according to claim 1, wherein said force generation means comprises a vacuum attraction mechanism.

4. A device according to claim 1, further comprising spheres provided at the positions between the mask and the holding surface.

5. An exposure apparatus comprising:

a mask holding apparatus comprising:

a holding surface for supporting a mask at three positions, wherein the mask includes a conical-hole portion, a V-groove portion and a flat portion; and force generation means, provided at positions corresponding to the three positions, for generating a non-mechanical force to pull the mask toward said holding surface; and exposure means for exposing and transferring a transfer pattern provided on the mask held on said mask holding device onto a wafer.

6. An apparatus according to claim 5, wherein said exposure means performs exposure with X-rays.

7. A mask holding method for holding a mask vertically, against gravity, said method comprising the steps of:

providing a mask with a conical-hole portion, a V-groove portion and a flat portion;

first pressing the conical-hole portion among the three portions against a corresponding projection of a mask chuck, wherein the conical-hole portion is arranged to be the uppermost of the three portions on the mask; and thereafter, pressing the V-groove portion and the flat portion against corresponding ones of three projections provided on the mask chuck, to hold the mask at the three positions.

8. A method according to claim 7, further comprising pressing the V-groove portion on the mask against a corresponding projection of the mask chuck after the conical-hole portion has been pressed against a corresponding projection of the mask chuck.

9. A method according to claim 7, further comprising vertically holding the mask against gravity.

10. A method according to claim 7, wherein the mask comprises an X-ray mask for X-ray lithography.

11. A mask holding method comprising the steps of:

providing a mask with a conical-hole portion, a V-groove portion and a flat portion; and engaging the conical-hole portion, the V-groove portion and the flat portion provided on the mask with three projections provided on a mask chuck and pressing them against each other, to vertically hold the mask at three positions against gravity, wherein the conical-hole portion among the three portions has the largest pressing force.

12. A method according to claim 11, wherein the V-groove portion has the second largest pressing force.

13. A method according to claim 11, wherein the flat portion has the smallest pressing force.

14. A method according to claim 11, wherein the mask comprises an X-ray mask for X-ray lithography.

15. A mask holding method comprising the steps of:

providing a mask with a conical-hole portion, a V-groove portion and a flat portion, the conical-hole portion being the uppermost portion on the mask; and engaging the conical-hole portion, the V-groove portion and the flat portion provided on the mask with three projections provided on a mask chuck and pressing them against each other, to vertically hold the mask at three positions against gravity.

16. A method according to claim 15, wherein the mask comprises an X-ray mask for X-ray lithography.

17. A mask for being held vertically, against gravity, said mask comprising:

a transfer pattern;

a mask frame having a holding surface; and a conical-hole portion, a V-groove portion and a flat portion provided at three positions on said holding surface, wherein an angle of said conical-hole portion is greater than an angle of said V-groove portion, with respect to said holding surface.

18. A mask according to claim 17, wherein the mask comprises a mask for X-ray lithography.

19. A mask holding method comprising the steps of:

providing a mask having a conical-hole portion, a V-groove portion and a flat portion; and generating a non-mechanical force to pull the mask toward a holding surface.

20. A method according to claim 19, wherein the non-mechanical force is one of a magnetic attraction force and a vacuum attraction force.

21. A method according to claim 19, wherein the mask is an X-ray mask for X-ray lithography.

22. A method for manufacturing micro-devices, comprising:

(i) holding a mask vertically, against gravity, by a method comprising the steps of:

providing a mask with a conical-hole portion, a V-groove portion and a flat portion;

first pressing the conical-hole portion among the three portions against a corresponding projection of a mask chuck, wherein the conical-hole portion is arranged to be the uppermost of the three portions on the mask;

thereafter, pressing the V-groove portion and the flat portion against corresponding ones of three projections provided on the mask chuck, to hold the mask at three positions; and (ii) transferring a pattern of the mask onto a substrate with an exposure operation.

23. A method for manufacturing micro-devices, comprising:

(i) holding a mask by a method comprising the steps of:

providing a mask with a conical-hole portion, a V-groove portion and a flat portion;

engaging the conical-hole portion, the V-groove portion and the flat portion provided on the mask with three projections provided on a mask chuck and pressing them against each other, to vertically hold the mask at three positions against gravity, wherein the conical-hole portion among the three portions has the largest pressing force; and (ii) transferring a pattern of the mask onto a substrate with an exposure operation.

24. A method for manufacturing micro-devices, comprising:

(i) holding a mask vertically, against gravity, the mask comprising:

a transfer pattern;

a mask frame having a holding surface;

a conical-hole portion, a V-groove portion and a flat portion provided at three positions on said holding surface, wherein an angle of said conical-hole portion is greater than an angle of said V-groove portion, with respect to said holding surface; and (ii) transferring a pattern of the mask onto a substrate with an exposure operation.

25. A method for manufacturing micro-devices, comprising (i) holding a mask by a method comprising the steps of:

providing a mask with a conical-hole portion, a V-groove portion and a flat portion; and generating a non-mechanical force to pull the mask toward a holding surface; and (ii) transferring a pattern of the mask onto a substrate with an exposure operation.

* * * * *

UNITED STATES PATENT AND TRADEMARK OFFICE
CERTIFICATE OF CORRECTION

PATENT NO. : 5,608,773
DATED : March 4, 1997
INVENTOR(S) : NOBUSIGE KORENAGA, ET AL.

It is certified that error appears in the above-indentified patent and that said Letters Patent is hereby corrected as shown below:

ON THE COVER PAGE:

At [57] ABSTRACT

Line 5, "three,positions" should read --three positions--.

IN THE DISCLOSURE:

Column 3

Line 52, "According" should read --According to--.

Column 7

Line 23, "or," should read --of--.

Column 8

Line 4, "End" should read --and--.

Column 9

Line 20, "exposure,i" should read --exposure--.

Line 24, "With" should read --with--.

Column 10

Line 51, "$\geq_{\mu 2}$" should read "$\geq \mu_2$--.

UNITED STATES PATENT AND TRADEMARK OFFICE
CERTIFICATE OF CORRECTION

PATENT NO. : 5,608,773  Page 2 of 2

DATED : March 4, 1997

INVENTOR(S) : NOBUSIGE KORENAGA, ET AL.

It is certified that error appears in the above-indentified patent and that said Letters Patent is hereby corrected as shown below:

<u>Column 11</u>

Line 16, "When" should read --when--.

<u>Column 12</u>

Line 35, "Can" should read --can--.

Line 43, "simplication," should read --simplification,--.

<u>Column 13</u>

Line 61, "(Oxidation)," should read --(oxidation),--.

<u>Column 16</u>

Line 52, "ing" should read --ing:--.

Signed and Sealed this

Twenty-third Day of September, 1997

Attest:

BRUCE LEHMAN

Attesting Officer      Commissioner of Patents and Trademarks